United States Patent [19]
Steiner et al.

[11] Patent Number: 5,838,272
[45] Date of Patent: Nov. 17, 1998

[54] ERROR CORRECTING SIGMA-DELTA MODULATION DECODING

[75] Inventors: Philip Steiner; Woodward Yang, both of Cambridge, Mass.

[73] Assignee: President and Fellows of Harvard College, Cambridge, Mass.

[21] Appl. No.: 838,056

[22] Filed: Apr. 17, 1997

[51] Int. Cl.$^6$ ...................................................... H03M 3/00
[52] U.S. Cl. ........................... 341/143; 341/144; 341/155
[58] Field of Search ..................................... 341/120, 118, 341/155, 144, 143

[56] References Cited

U.S. PATENT DOCUMENTS

| | | | |
|---|---|---|---|
| 5,068,661 | 11/1991 | Kaneaki et al. .......................... | 341/143 |
| 5,124,705 | 6/1992 | Voorman .................................. | 341/143 |
| 5,153,593 | 10/1992 | Walden et al. ........................... | 341/143 |
| 5,181,032 | 1/1993 | Ribner ...................................... | 341/143 |
| 5,341,135 | 8/1994 | Pearce ...................................... | 341/120 |
| 5,736,950 | 4/1998 | Harris et al. ............................. | 341/143 |
| 5,742,246 | 4/1998 | Kou et al. ................................. | 341/143 |

OTHER PUBLICATIONS

Boser, et al., "The Design of Sigma–Delta Modulation Analog–to Digital Converters," *IEEE J. Solid–State Circuits*, vol. SC–23, No. 6, pp. 1298–1308 (Dec. 1988).

Shoji, et al., "Improved Double Integration Delta–Sigma Modulations for A to D and D to A Conversion," *IEEE Proc. ISCAS '87*, pp. 451–454 (May 1987).

Cataltepe, et al., "Digitally Corrected Multi–Bit ΣΔ Data Converters," *IEEE Proc. ISCAS'89*, vol. 37, No. 3, pp. 647–650 (May 1989).

Candy, "A Use of Double Integration in Sigma Delta Modulation," *IEEE Trans. Commun.* vol. COM–33, No. 3, pp. 249–258 (Mar. 1985).

Candy, "Using Triangulary Weighted Interpolation to Get 13–Bit PCM from a Sigma–Delta Modulator," *IEEE Trans. Commun.*, vol. Com–24, pp. 1268–1275 (Nov. 1976).

*Primary Examiner*—Brian K. Young
*Attorney, Agent, or Firm*—Hamilton, Brook, Smith & Reynolds, P.C.

[57] ABSTRACT

The performance of sigma delta analog to digital conversion systems is enhanced by instrumenting the modulator with an observation circuit which provides quantized estimates of the modulator's state values. These state estimates are filtered separately and the result is added to the output of the decimator. This technique lowers the noise floor of the signal band and achieves performances better than those predicted by the spectrum of the modulator output. Error Correcting is particularly well suited to very low oversampling ratios. Finally, the correction is calculated and added in the digital domain so that this technique can be employed with existing architectures with only minor modifications.

51 Claims, 20 Drawing Sheets

ERROR CORRECTING SIGMA-DELTA MODULATION DECODING

GOVERNMENT FUNDING

This invention was supported by NSF Grant No. MIP92-57964 and ONR Grant No. N00014-89-J-1023 and the government has certain rights to this invention.

BACKGROUND OF THE INVENTION

Analog-to-digital converters (ADCs) convert electronic analog signals to digital signals. An analog signal may simply be a voltage across some electronic component, or it may represent a real-world signal such as an audio signal which originates as variations in air pressure and is converted to an electronic signal through a transducer such as a microphone. In order for these signals to be processed by digital filters or stored on digital media such as audio CDs, they must be converted to digital signals. Digital-to-analog converters (DACs), on the other hand, perform the inverse operation of converting digital signals to analog.

Conventional ADCs, such as dual slope, successive approximation and flash converters typically have high-accuracy problems. Due to the difficulty of accurately matching components on a semiconductor chip, it is difficult to obtain conversion accuracy beyond 10 bits.

To prevent aliasing of out-of-band noise into the signal band, an ADC must sample an analog signal at a minimum of twice its bandwidth. This is known as the Nyquist rate. Oversampling methods, where the sampling rate is substantially higher than the Nyquist rate, have been developed where even a two-level (one bit) conversion at the higher sample rate can produce an accuracy of between 16 and 20 bits after filtering. The oversampling ratio, or OSR, is defined as the sampling rate divided by the Nyquist rate.

One such class of ADC is based on sigma-delta architecture. Sigma-delta systems (ADCs specifically) generally comprise two subsystems: (i) a modulator, which samples an analog signal at a high oversampling frequency and outputs a high frequency bit steam (usually single bit); and (ii) a decimation filter, or decimator, which processes the high-frequency bit stream to produce a decimated, low-frequency multi-bit signal. The modulator typically comprises one or more delay stages followed by a (usually 1-bit) modulator quantizer. The output of the modulator quantizer is the output of the modulator, and is fed back via a DAC to one or more of the delay stages. "Encoding" in this context refers to the processing performed by the modulator, while "decoding" refers to the processing performed by the decimation filter (decimator).

Sigma-delta systems have become prevalent, in the last decade, in integrated circuit implementations of analog to digital and digital to analog applications. Performance improvements in these systems have developed rapidly since their introduction into mainstream use. Typically, improving the performance of a sigma-delta system has involved innovation in modulator architecture, such as using higher order modulators, i.e., modulators with more stages, or using more quantization levels in the feedback loop. These changes require significant modification of current topologies and introduce other complexities such as the accurate matching of the modulator quantizer to the DAC in the feedback loop of multi-bit systems. For the most part, research has focused on the design of the modulator to improve the overall performance of the system. In fact, the performance of sigma-delta systems is usually defined by the frequency spectrum of the modulator output, relegating the task of extracting the desired signal to a conceptual linear digital decimation filter. The overall sigma-delta system performance is thus thought of as limited by the spectral characteristics of the modulator output, and the decimation filter simply approaches the performance predicted by this spectral characteristic.

SUMMARY OF THE INVENTION

The present invention leaves the architecture of a given modulator unchanged, except for the addition of observation circuitry. This observation circuitry provides a limited precision estimate of the modulator state values (delay stages) but leaves the essential functionality of the modulator intact (i.e., the modulator's input/output relationship is unchanged). A separate processing function is performed on these state estimates and the result is used to obtain a closer approximation to the input value than would otherwise be available.

In accordance with the present invention, an ADC comprises a modulator, a decimation filter, a state valve quantizer and a state value processor. The modulator converts an analog input into a high frequency bit stream. In a preferred embodiment, the decimation filter receives the high frequency bit stream and converts it into a reduced-frequency multibit signal output which represents an estimate of the analog input. The state value quantizer and state value processor provide an estimate of the error between the analog input and the decimation filter's output. The present invention uses the error estimate to reduce the overall error in the decimation filter's output signal.

The decimation filter generates its reduced-frequency multibit signal output by filtering the high-frequency bit stream output of the modulator and decimating the result. The error estimator filters a state value of the modulator (e.g., the state of a delay stage) to produce its error estimation which is also a multibit signal. These two multibit signals, that is, the outputs of the decimation filter and the error estimator, are then combined to provide a multibit output signal.

Alternatively, because a decimation filter is used to produce a multibit signal from the high-frequency bit stream, the error estimator can select the multibit signal output from the filter. If the decimation filter is a finite impulse response filter (FIR), the error estimate can control the length of the filter to minimize the error.

Both the decimation filter and the error estimator may be FIRs. The estimated error is produced from at least one state estimate corresponding to a delay stage within the modulator. State estimates are obtained by quantizating state values using flash ADCs or pipelined ADCs for the state value quantizers. The quantization levels may be linearly spaced, that is, spaced evenly, or they may be logarithmically spaced. Furthermore, state values may periodically be reset to some constant value, preferably zero, preferably at the oversampling rate or a submultiple thereof, i.e., ½, ⅓, ¼ of the oversampling rate. Alternatively, the error estimator may be used to control the reset signal.

While the high-frequency bit stream output of the modulator is typically a single-bit bit stream, it could be a multiple-bit bit stream instead. The modulator may comprise a lowpass modulator or a bandpass modulator.

Non-error correcting sigma delta ADCs generally operate at very high OSRs, typically 32, 64 or greater. A few architectures work at OSRs as low as 8. It is well known in the art that the bandwidth $F_B$ of an input signal to a sigma-delta converter is limited to $F_S/(2*OSR)$ where $F_S$ is the oversampling rate. Because there is a practical ceiling on circuit operating speed, input signals are generally limited to relatively low frequency bandwidths such as audio frequencies. The present invention is able to operate at high OSRs as well, but in addition provides excellent performance at OSRs as low as 4, thereby expanding the potential bandwidth of any input signals.

In an alternate embodiment, the state value processor comprises a differentiator. The output of the differentiator is combined with the output of the modulator and a single decimation filter processes this combined signal.

Difficulty in matching analog components in any implementation practically guarantees that components will be mismatched. This in turn degrades the performance of the converter. The weights given to the taps of the decimation and error filters can be calibrated to rectify these mismatches. Calibration circuitry is described which adjusts the weights of the error filter, or alternatively, the weights of the decimation filter, when the input is a DC signal, by looking for the smallest fluctuations in the converter output.

The present invention uses a true quantizer (i.e., an ADC) to produce an estimate of one or more internal state values. In a preferred embodiment, this ADC is a flash or pipelined ADC and thus operates at the same rate $F_S$ as the modulator. While it may seem counter-intuitive to use an ADC to correct a sigma-delta ADC, this state quantizer adds precision to the non-error corrected sigma-delta converter.

Were a second sigma-delta converter used to provide an estimate of a state value, it would have to operate at a high OSR compared with the first sigma-delta modulator of the original architecture, because the state value has a signal bandwidth of $F_S$. Since sigma-delta converters are normally effective only at high OSRs compared to the bandwidth of their input signal, the OSR of such a sigma-delta converter used to quantize a state value would have to be extremely high, either severely limiting the bandwidth of an input signal to the overall converter, or dramatically increasing the complexity and cost of producing such a converter.

In any case, the single filter embodiment of the present invention cannot use a sigma-delta modulator operating at $F_S$ in the error correction (EC) stage because it requires a direct estimate of the state, such as a true quantizer provides, rather than a modulated version such as a sigma-delta modulator provides. In other words, a sigma-delta modulator performs signal acquisition, providing only a spectral analysis of the state, while a true quantizer performs true date acquisition such that its output at any time represents the state value at that time and corresponds with the input signal at a time offset by a fixed delay.

Because true data acquisition of the state values is performed, an advantage of the present invention over the prior art is that the present invention does not require an analog coupling filter between the original circuit and the EC circuit. This is of importance for the implementation on a chip since the main point of sigma-delta modulation is to eliminate the need for a good analog filter.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 10a illustrates the response of this system without a reset and without any error correction. FIG. 10b illustrates the response of this system with reset but without error correction. FIG. 10c illustrates the response of this system with both reset and L2 error correcting.

FIG. 15a shows the spectral characteristics of the modulator. FIG. 15b shows the response of the filter without error correction while FIG. 15c shows the response of the filter with L1 error correction with 8-bit quantization.

DESCRIPTION OF A PREFERRED EMBODIMENT

Figure 1:
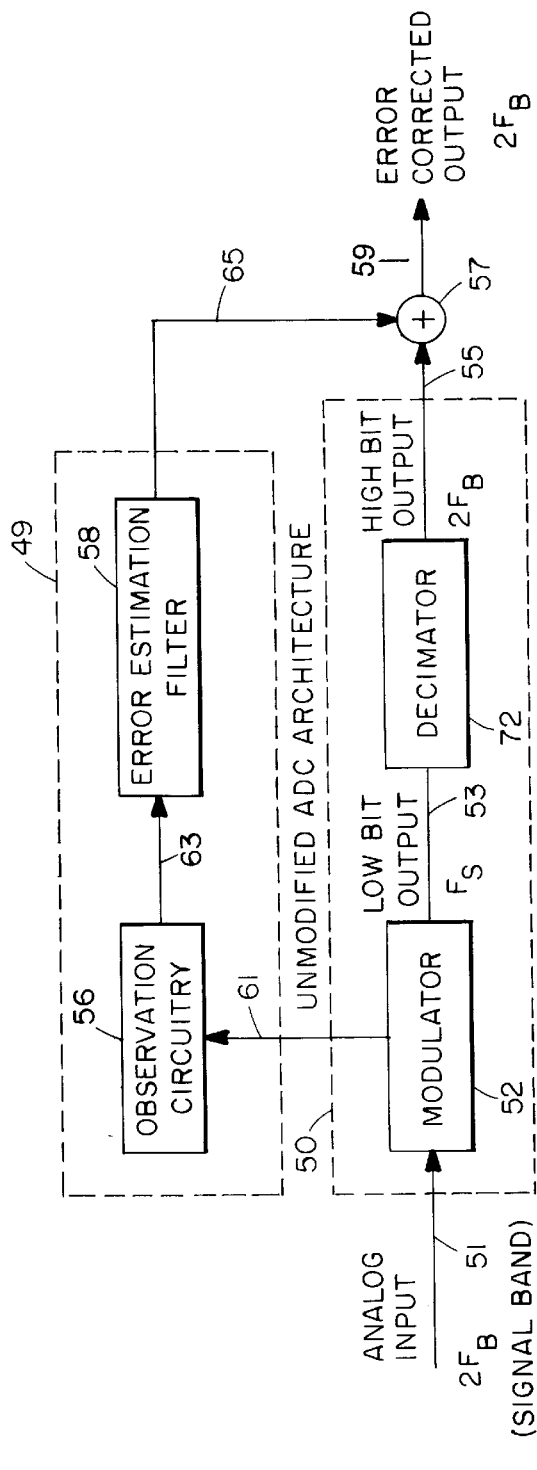
FIG. 1 is a block diagram illustrating the error correcting ADC architecture.

FIG. 1 illustrates the architecture of the present invention. A standard sigma-delta system 50, shown within the dotted box, comprises a modulator 52 and a decimator 72. An analog signal 51 with bandwidth $F_B$ is sampled by the modulator 52 at a high frequency $F_S$. From the analog signal, the modulator produces a high-frequency ($F_S$) bit stream 53 which is fed into the decimator 72. The decimator outputs a decimated multibit bit stream 55 at the lower sample rate $2F_B$. This decimator output 55 is a digital representation of the analog input 51.

The error correcting system of a preferred embodiment of the present invention adds error correcting circuitry 49 comprising observation circuitry 56 and an error estimation filter 58. The observation circuitry provides a limited precision estimate 63 of the modulator's state values 61 but leaves the essential functionality of the modulator intact (i.e., the modulator's input/output relationship is unchanged). The error estimation filter 58 processes these state estimates and its output 65 is added to the output of the decimation filter 55 by adder 57 to produce a multi-bit, low-frequency ($2F_B$) error-corrected output 59.

This modified error correcting architecture improves the overall performance of the standard sigma-delta system beyond that predicted by the spectral characteristic of the modulator output alone. The performance enhancement is provided by the observation and error estimation components rather than by modifying the modulator.

Figure 2:
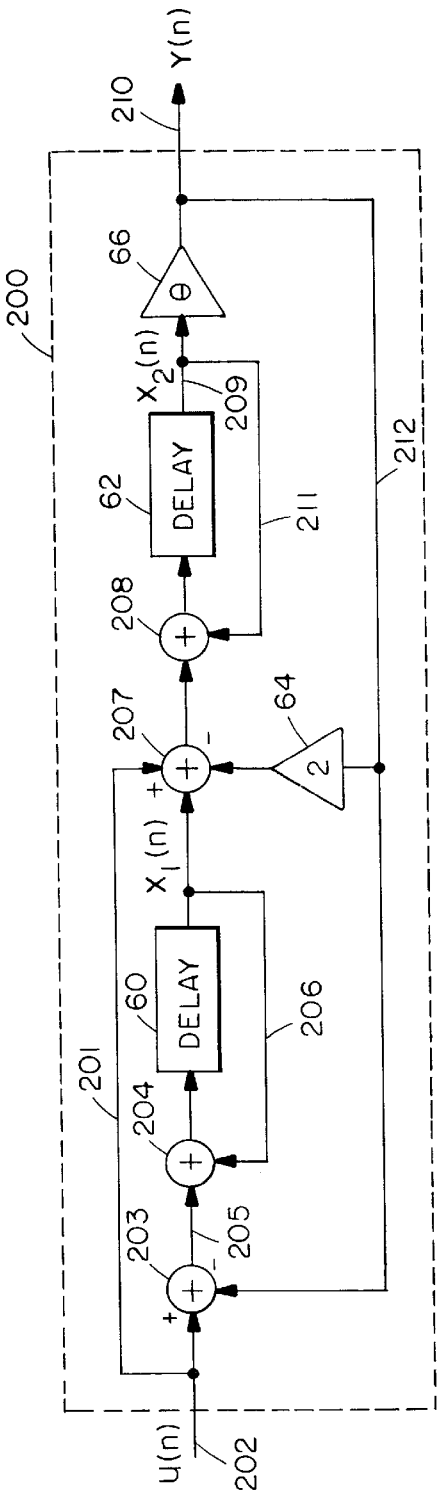
FIG. 2 is a block diagram illustrating a 2-stage feedforward Candy system.

Error correction improves the performance of any sigma-delta system. A preferred embodiment uses a second order Candy sigma-delta modulator which is illustrated (without error correction) in FIG. 2. The degree of "order" derives from the number of delay stages. The modulator comprises the 1st-stage delay 60, the 2nd-stage delay 62, a modulator quantizer 66 and a multiplier 64. Analog input signal u(n) is sampled at the oversampling frequency $F_S$ by the modulator 200 at the modulator input 202. It enters the first stage delay 60 via adders 203 and 204, and is fed forward to the second stage delay 62 via feed-forward path 201 and adders 207 and 208. Output y(n) 210 is a high-frequency single-bit bit stream which feeds a decimation filter (not shown in FIG. 2). The output of the first stage $x_1(n)$ is fed into the input of the second stage through adders 207 and 208. In a preferred embodiment, the quantizer 66 has only two possible output values: 1 if $x_2$ is equal or greater than 0, −1 if $x_2$ is less than 0. Its output y(n) 210 is the output of the modulator 200. This output 210 is negatively fed back 212 to the first stage by adder 203, and is negatively fed back to the second stage by adder 207 after being multiplied by a factor of two by multiplier 64. The outputs of the delays are also fed back via feedback paths 206 and 211 to their inputs through adders 204 and 208 respectively.

Figure 3A:
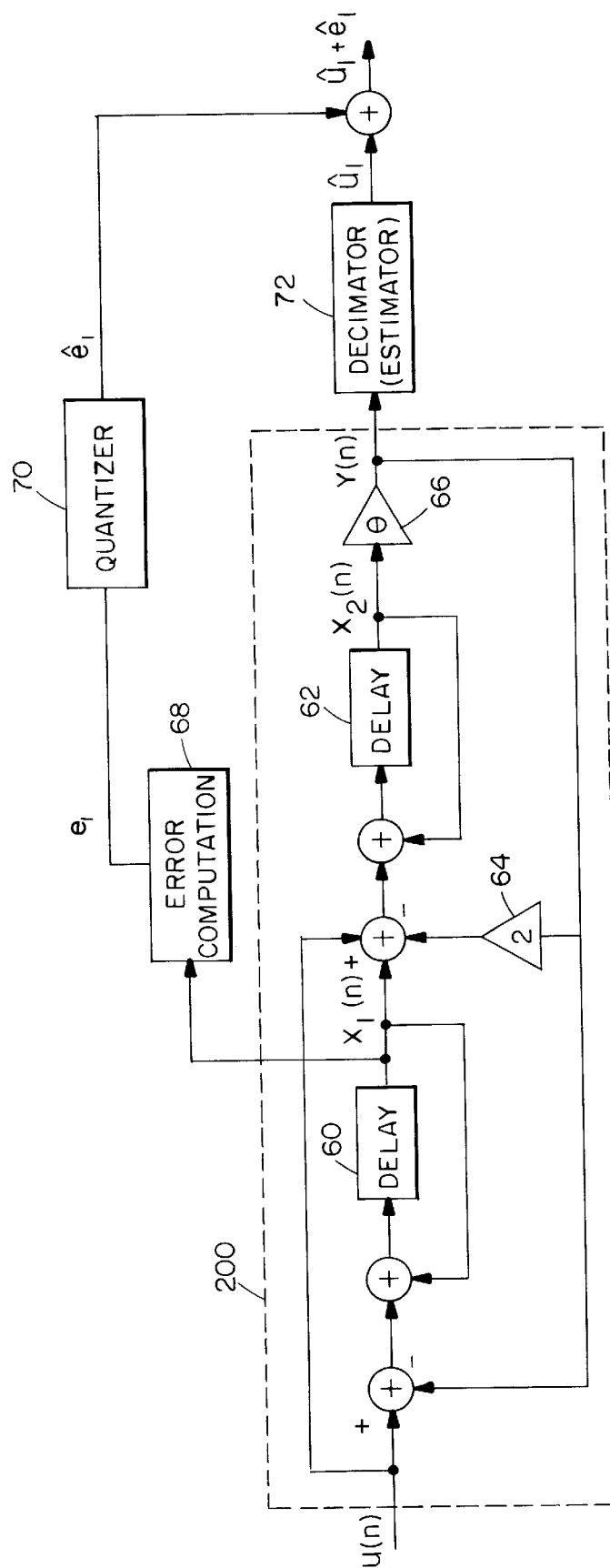
FIG. 3a is a block diagram of an error-correcting sigma-delta ADC using quantized estimates of the error term itself.

FIG. 3a shows this second order Candy modulator 200 followed by a decimation or error estimation filter 72. The modulator and decimation filter together make up the ADC architecture shown in the dashed box of FIG. 1 as 50. FIG. 3a shows that it is possible to observe a state value of the modulator, in this case $x_1(n)$, the value of the first delay stage 60. As is shown below, an error $e_1$ between the input signal u(n) and the output of the decimator $\hat{u}_1(n)$ can be calculated from the value of $x_1$ by error computation hardware 68. This error is digitized with quantizer 70, yielding a digital estimate of the error $\hat{e}_1$. Finally, this error estimate $\hat{e}_1$ can be added to the decimation filter output $\hat{u}_1(n)$ to yield a higher accuracy estimate $\hat{u}_1(n)+\hat{e}_1$ of the input signal u(n) than the sigma-delta system could yield without the added error correction architecture.

Figure 3B:
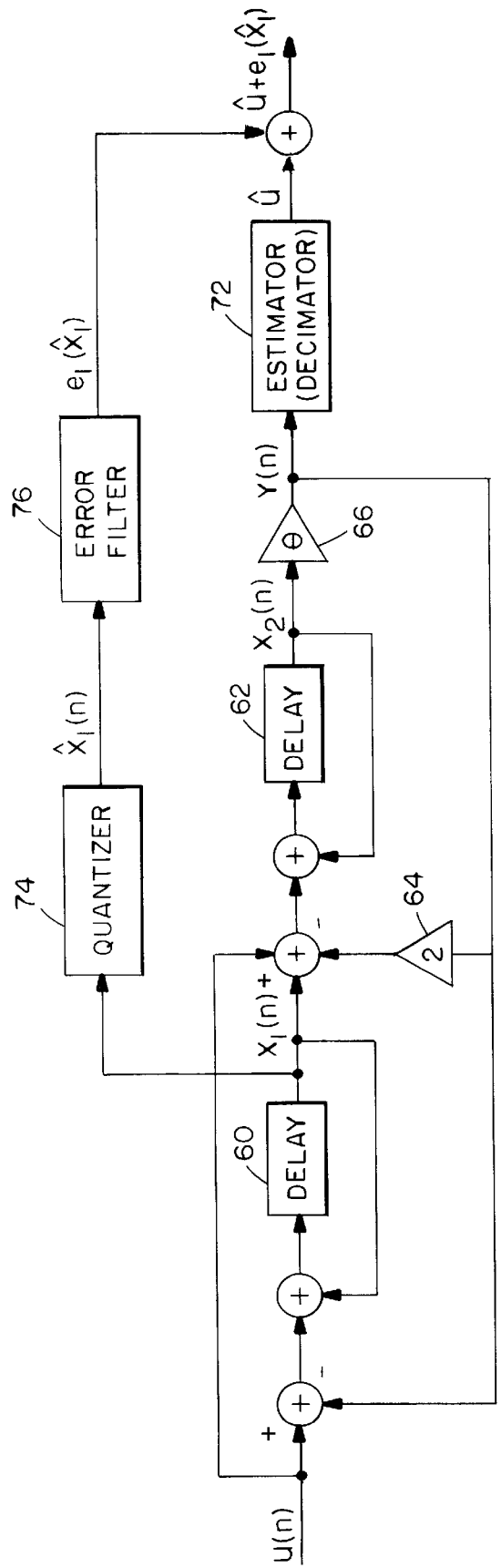
FIG. 3b is a block diagram of an error-correcting sigma-delta ADC using quantized state estimates.

In practice, the state values must be quantized for implementation considerations. As FIG. 3b illustrates, in a preferred embodiment, the state value $x_1$ is digitized by state value quantizer 74, yielding a digital estimate of the state value $\hat{x}_1$. This state value estimate is then passed through an error filter 76 which calculates an estimate of the error $e_1(\hat{x}_1)$. This error estimate is then added to the decimation filter output to produce a high resolution estimate $\hat{u}+e_1(\hat{x}_1)$ of the input signal u(n).

The difference equations describing the dynamics of the second order Candy modulator show how the error is derived from the state values. The equations are given by $$x_1(n) = x_1(n-1) + u(n-1) - \Theta[x_2(n-1)] \tag{1a}$$

$$x_2(n) = x_2(n-1) + x_1(n-1) + u(n-1) - 2\Theta[x_2(n-1)] \tag{1b}$$

where $\Theta$ is a one bit quantizing function whose transfer function is given, for any input value z, by $$\Theta[z_n] = \begin{cases} +1; z \geq 0 \\ -1; z < 0 \end{cases} \tag{2}$$

If the input to the system is DC, then u(k)=u for all k. Equation (1) can be iteratively expanded in time to give $$x_1(n) = x_1(0) + nu - \sum_{j=0}^{n-1} \Theta[x_2(j)] \tag{3a}$$

$$x_2(n) = x_2(0) + nx_1(0) + \frac{1}{2} n(n+1)u - \sum_{j=0}^{n-1} (n-j+1)\Theta[x_2(j)] \tag{3b}$$

which can then be rearranged to give $$u = \frac{1}{n} \sum_{j=0}^{n-1} \Theta[x_2(j)] + \frac{1}{n} (x_1(n) - x_1(0)) \tag{4a}$$

$$u = \frac{1}{(1/2)n(n+1)} \sum_{j=0}^{n-1} (n-j+1)\Theta[x_2(j)] + \frac{1}{(1/2)n(n+1)} (x_2(n) - x_2(0) - nx_1(0)) \tag{4b}$$

There are two terms on the right-hand side of each of equations (4a) and (4b). The first term involves only the modulator output (i.e., $\Theta[x(j)]$) and represents a filtered version of the modulator output which provides an estimate of the input. The second term involves only the states of the modulator and represents the error in the estimate of the input. Thus, equation (4a) and (4b) can be written as $$u = \hat{u}_1 + e_1(x_1) \tag{5a}$$

$$u = \hat{u}_2 + e_2(x_1, x_2) \tag{5b}$$

where the $\hat{u}$ are the estimates of the input provided by filtering the modulator output, and the $e_i$ are the errors in these estimates. All of the information about the errors is contained within the states. If the exact value of the states were known, then the input could be determined exactly. The states, however, are analog and their exact values are inaccessible.

FIG. 3a shows that if a quantized estimate of the error were available, equation (5) could be rewritten as $$u = (\hat{u}_1 + \hat{e}_1) + (e_1 - \hat{e}_1) \tag{6a}$$

$$u = (\hat{u}_2 + \hat{e}_2) + (e_2 - \hat{e}_2) \tag{6b}$$

where the $\hat{e}$ are the quantized estimates of the errors. The new estimate of the input is given by the sum of the original estimate and the estimate of the error, while the new error is the difference between the error and the estimate of the error. The new error is therefore reduced by the number of bits of quantization in the estimate of the error and the performance of the system is improved by the same amount.

As previously discussed, it is difficult to directly quantize the error since this would involve storing and filtering the analog states prior to quantization. The present invention uses quantized estimates of the states as shown in FIG. 3b to estimate the error, giving $$u=(\hat{u}_1+e_1(\hat{x}_1))+(e_1(x_1)-e_1(\hat{x}_1)) \quad (7a)$$

$$u=(\hat{u}_2+e_2(\hat{x}_1,\hat{x}_2))+(e_2(x_1,x_2)-e_2(\hat{x}_1,\hat{x}_2)) \quad (7b)$$

The error in equation (7) is again reduced in size compared to that of equation (5) and the performance of the system is improved. This is the essential idea behind error correction (EC).

The performance enhancement provided by error correcting is dependent on the estimation filter employed. For example, it has been observed that the same error correcting system, simulated with a low frequency input, provides significant performance improvement for a sinc filter, not as much for a $sinc^2$ filter, and almost no performance improvement for a $sinc^3$ filter. This is due to the fact that the aforementioned filters provide increasing performance as the order of the filter increases. The size of the modulation error thus gets smaller in the successive filters and with a finite precision estimate of the state values, the precision of the estimate of the error decreases as the error gets smaller. Thus, in theory, providing performance enhancements for these successively better filters would require successively more bits of quantization on the state values. However, this theoretical limitation tends to be counterbalanced by practical limitations in the complexity of FIR filters.

There are two aspects to the performance enhancement provided by error correcting. First, error correcting lowers the noise floor of the signal band thereby gaining additional performance (over that predicted by the spectrum of the modulator output). This is particularly important at low OSR. Second, it enhances the performance of non-optimal filters by adjusting for the larger error provided by these filters. This second consideration would seem to indicate that error correcting does not achieve anything that a better filter could not also achieve. This is not the case. It is true that at high OSR and long filter lengths the error is quite small and the loss of precision incurred by filtering the quantized states may not be able to account for this smaller error. There are design techniques that can circumvent this problem to some degree; however, the real value of error correcting lies in lowering the noise floor in modulators with very low oversampling ratios. In this case even an optimal filter can only provide the performance specified by the spectrum of the modulator output while EC can actually provide better performance than this. Thus, EC is not equivalent to implementing a better filter.

In order for error correcting to function well, the range of the state values should be known fairly well so that the quantizer making the state estimates can be scaled properly. In simulation, state values are not limited by practical supply voltage limitations. Thus, accurate bounds on the states are essential. For the Candy system as well as for some higher order systems, there have been a number of papers demonstrating such bounds. In any implementation, there is a limit on the magnitude of the state, above which clipping occurs. This bound is certainly not the most desirable choice, however it does provide an absolute limit on the state value. Even if bounds on the state values are known it is not clear what is the optimal selection of level spacing in the state value quantizer. In a preferred embodiment, constant level spacing has been employed. The use of logarithmic spacing as an alternative is currently under investigation.

IMPLEMENTING ERROR CORRECTING SYSTEMS

Figure 6:
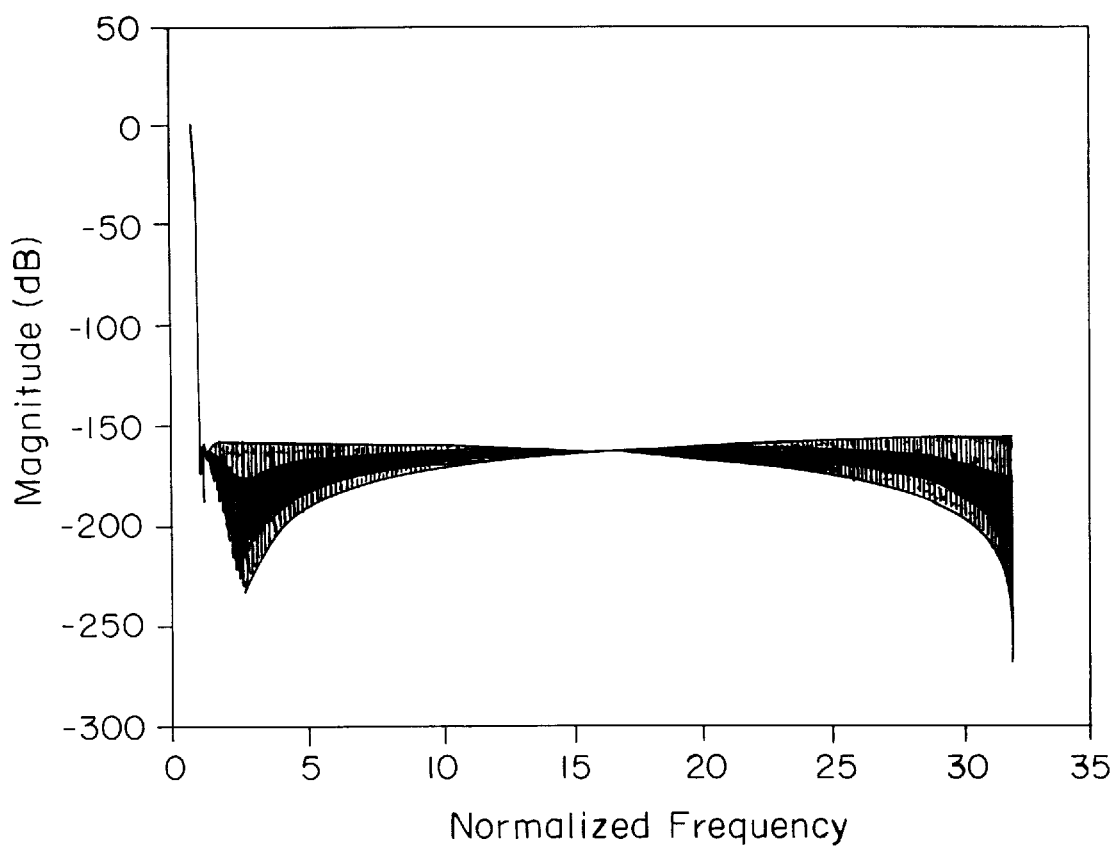
FIG. 6 illustrates the transfer function of the estimation filter used in simulations.
Figure 16:
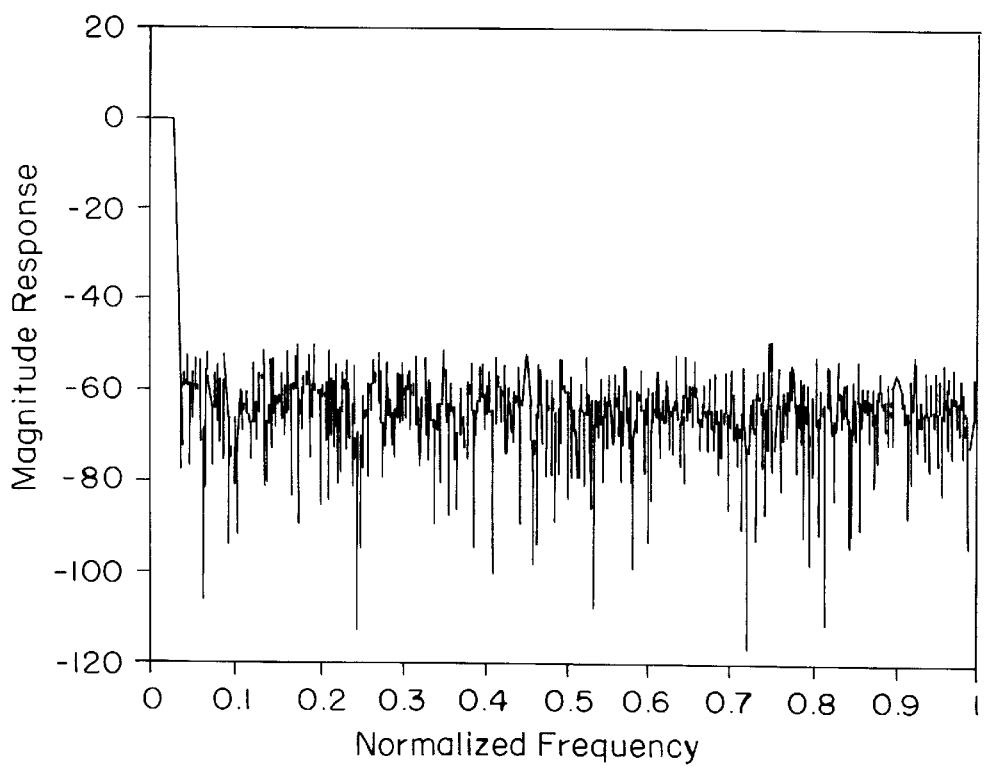
FIG. 16 illustrates the spectral characteristics of the filter of FIG. 6 after the filter weights have been quantized to 8 bits.

Error correction has a number of features which make it well suited to real implementations. First, the filter coefficients of the estimation filter are limited in precision to a certain number of bits, far less than was used in simulations. This implies that the filter characteristics of any implemented estimation filter will not be as good as the simulated filters. The modulation error in the implemented system will thus tend to be larger. Since the filter coefficients of the error filter are dependent only on the actual implemented estimation filter coefficients, no reduction in the performance enhancement due to EC results from lower precision coefficients. In fact, since the implemented filter will tend to have a larger error, EC techniques should actually provide improved performance enhancement over that predicted in the simulations. Thus, EC will tend to make up for limitations in the implementation of real systems. FIG. 6 shows the spectral characteristics of the value estimation filter used in simulations. FIG. 16 shows the modified spectrum for this same filter if the coefficients of this filter are only allowed to take on eight bits of precision. The performance of this filter is degraded substantially, with the stop band rejection decreasing by more than 100 dB.

EC decoding provides substantial performance improvements in low OSR systems. Previous techniques to improve the performance of these systems has relied on modifying the architectural specifications of the modulator. This usually involves implementing higher order modulators or multi-bit systems with various techniques to accurately match the ADC with the DAC in the feedback loop. EC does not modify the architecture of the modulator, except to add an observation system. It leaves the feedback loop untouched. In addition, EC does not depend upon accurate matching of analog values, as most of the EC circuitry is implemented digitally. Only the state value quantizer interfaces with the analog domain, and because the error term usually involves the difference between succeeding state values, errors in the state value quantizer will tend to cancel. Therefore, EC is fairly straightforward to implement with existing modulator designs.

EC is an extremely general technique which can be implemented with bandpass sigma-delta systems and non-linear decoding techniques, as well as a variety of other systems. The modulator architecture and decoding equations are changed, however the fundamental principles of the technique can be carried over.

NATURAL DECODING EQUATIONS

Figure 4:
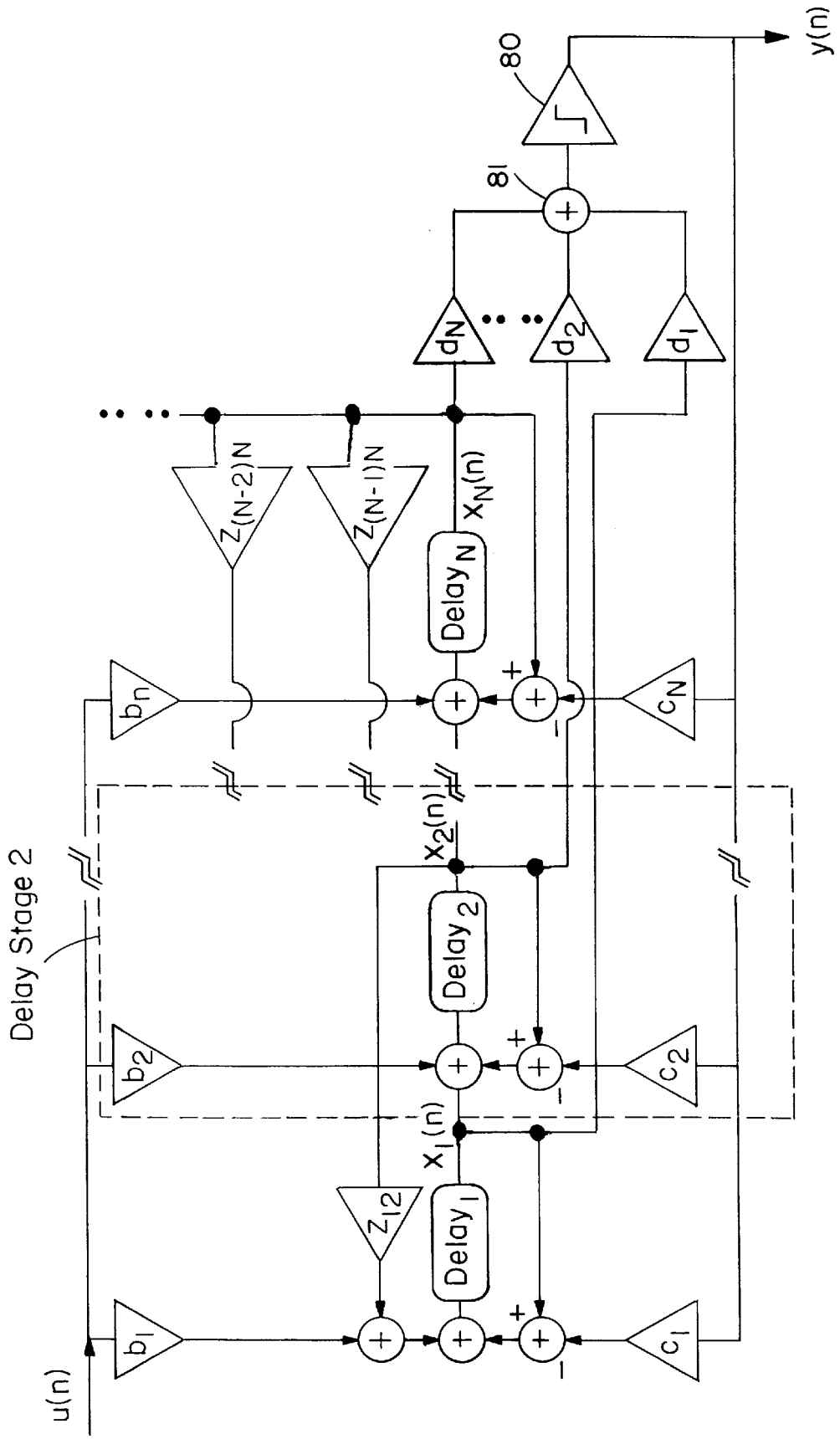
FIG. 4 illustrates a general Nth order modulator.

FIG. 4 illustrates a general N'th order interpolative sigma-delta modulator which can be described, in a state space formulation, by N coupled difference equations. The modulator comprises N delay stages. For example, Delay Stage 2 receives the input signal u(n) scaled by factor $b_2$. The output y(n) of the quantizer 80 is scaled by a factor of $c_2$ and negatively fed back to delay $Delay_2$. The state value of Delay Stage 2, $x_2(n)$, is scaled by factor $Z_{12}$ and fed back to previous stages (in this case the first stage). $x_2(n)$ is also scaled by factor d2, summed with the state values of all of the other stages at adder 81 and the sum is quantized by quantizer 80. The difference equations can be cast in a matrix form to give a general equation for the modulator.

$$\vec{x}(n) = A\vec{x}(n-1) + \vec{b}u(n-1) - \vec{c}\Theta[\vec{d}\cdot\vec{x}(n-1)]y(n) = \Theta[\vec{d}\cdot\vec{x}(n)]] \quad (8)$$

where $x_i$, the output of the i'th delay Delay$_i$, is the i'th state of the system, u is the input to the modulator, A is the linear part of the transition matrix of the system, $\vec{b}$, $\vec{c}$ and $\vec{d}$ are parameters describing the modulator's feedback and feedforward architecture, $\Theta$ is the quantizer function, and y is the output of the modulator. In the case of a single bit modulator quantizer, $\Theta$ is given by equation (2). Equation (8) can be recursively expanded to give $$\begin{aligned}\vec{x}(n) &= A^m\vec{x}(n-m) + \sum_{j=n-m}^{n-1} A^{n-j}\vec{b}u(j) - \sum_{j=n-m}^{n-1} A^{n-j}\vec{c}\Theta[\vec{d}\cdot\vec{x}(j)] \\ &= A^m\vec{x}(n-m) + \sum_{j=n-m}^{n-1} A^{n-j}\vec{b}u(j) - \sum_{j=n-m}^{n-1} A^{n-j}\vec{c}y(j)\end{aligned} \quad (9)$$

Defining a diagonal normalization matrix, M, with elements $$M_{kk} = \left(\sum_{j=n-m}^{n-1} (A^{n-j}\vec{b})_k\right)^{-1} \quad (10)$$

equation (9) can be written as $$M\sum_{j=n-m}^{n-1} A^{n-j}\vec{b}u(j) = M\left(\vec{x}(n) - A^m\vec{x}(n-m) + \sum_{j=n-m}^{n-1} A^{n-j}\vec{c}y(j)\right) \quad (11)$$

Equation (11) represents N decoding equations for the given modulator. Consider the k'th such equation. It indicates that, given an output sequence y(j), processing this sequence with a filter $$M_{kk}\sum_{j=n-m}^{n-1} (A^{n-j}\vec{c}y(j))_k$$

results in a reconstruction of a filtered version of the input, $$M_{kk}\sum_{j=n-m}^{n-1} (A^{n-j}\vec{b}u(j))_k,$$

to within an error of $M_{kk}(\vec{x}(n) - A^m\vec{x}(n-m))_k$. These terms are therefore referred to as the estimator, the prefilter, and the error respectively. In addition, equation (11) is referred to as the natural decoding equation for the modulator because it arises directly from the architectural specifications of the modulator and, more importantly, because the error term involves only the first and last states of the time sequence n-m, . . . ,n. Therefore, the state of the modulator at any time, m, can be seen to represent the overall encoding error (referenced to time 0) of the modulator. Therefore, for the N natural decoding equations, we refer to the above terms as the natural prefilter, natural estimator, and natural error.

While the modulator has been described with lowpass characteristics, a modulator with bandpass characteristics may also be utilized. In this case, Eq. 8 becomes $$\vec{x}(n) = A\vec{x}(n-1) + B\vec{x}(n-2) + \vec{b}_1 u(n-1) + \vec{b}_2 u(n-2) - \vec{c}_1\Theta[\vec{d}\cdot\vec{x}(n-1)] - c_2\Theta[\vec{d}\cdot\vec{x}(n-2)] \quad (8a)$$

where the matrix B is of the same dimension as A and is llikewise determined by the architecture of a given system.

GENERAL DECODING EQUATIONS

The natural decoding equations fix the filter coefficients which are used to filter the modulator. These coefficients do not always result in a transfer function which is well suited for a particular application. Most of the time different filter characteristics, and hence coefficients will be implemented in the estimation filter. When the output of a modulator is filtered with an arbitrary FIR filter, the decoding equations become $$M\left(\vec{b}\sum_{j=n-m}^{n-1} w_{j-n+m+1}u(j)\right) = \quad (12)$$

$$M\left(\sum_{j=n-m}^{n-1} w_{j-n+m+1}(\vec{x}(j+1) - A\vec{x}(j)) + \vec{c}\sum_{j=n-m}^{n-1} w_{j-n+m+1}y(j)\right)$$

where the FIR filter length is m and the normalization matrix, M, is set to $$M_{kk} = \left(b_k \sum_{j=1}^{m} w_j\right)^{-1} \quad (13)$$

In this case the error term is dependent on all the states during the time sequence n-m, . . . ,n. The prefilter and estimator employ the same filter coefficients and differ only by a gain term $c_k/b_k$. Note, however, that the error term also contains the same coefficients as well. The factor of A alters the filter coefficients in the error term only by an overall multiplicative factor, and is in fact, usually unity (except for high order systems where resonators are employed).

Note that the prefilter and estimator terms in all N of the decoding equations represented by equation (12) are identical (scaled by $c_k/b_k$) . Thus, the error in all of these equations must also be identical. It would seem that the N decoding equations are identical. In fact, this is not the case. There is additional information contained within the architectural specifications of the modulator (A), which must be substituted back into some of the decoding equations.

For the preferred second-order Candy embodiment shown in FIG. 3b, the system is shown in the matrix formulation and AC inputs are considered for both the natural and general estimation filters. The matrix formulation of this system is given by $$\begin{pmatrix}x_1(n) \\ x_2(n)\end{pmatrix} = \begin{bmatrix}1 & 0 \\ 1 & 1\end{bmatrix}\begin{pmatrix}x_1(n-1) \\ x_2(n-1)\end{pmatrix} + \begin{pmatrix}1 \\ 1\end{pmatrix}u(n-1) - \begin{pmatrix}1 \\ 2\end{pmatrix}\Theta[x_2(n-1)] \quad (14)$$

The natural decoding equations for this system (between n-m and n) are given by $$\frac{\sum_{j=n-m}^{n-1} u(j)}{m} = \frac{x_1(n) - x_1(n-m)}{m} + \frac{\sum_{j=n-m}^{n-1} y(j)}{m} \quad (15a)$$

$$\frac{\sum_{j=n-m}^{n-1}(n-j)u(j)}{(1/2)m(m+1)} = \frac{x_2(n) - x_2(n-m) - mx_1(n-m)}{(1/2)m(m+1)} + \frac{\sum_{j=n-m}^{n-1}(n-j+1)y(j)}{(1/2)m(m+1)} \quad (15b)$$

The performance of these decimators is determined by the size of the error terms for a given filter size, m. For this system, the state values are stable for most classes of AC inputs and the ranges of $x_1$ and $x_2$ are of the same order of magnitude. Therefore, it can be seen that both the natural decoding equations provide similar performance, as the error terms in equations (15a) and (15b) are of the same order of magnitude. Note how both natural error terms are dominated by the $x_1$ term. Removing the dependence of the natural error term in (15b) on $x_1$ should improve the performance of the system by a factor of (½) (m+1). The two natural decimators for the Candy system are a boxcar filter and a ramp filter.

The general decoding equations for the Candy system are $$\frac{\sum_{j=n-m}^{n-1} w_{j-n+m+1} u(j)}{\sum_{j=1}^{m} w_j} = \quad (16a)$$

$$\frac{\sum_{j=n-m}^{n-1} w_{j-n+m+1}(x_1(j+1) - x_1(j))}{\sum_{j=1}^{m} w_j} + \frac{\sum_{j=n-m}^{n-1} w_{j-n+m+1} y(j)}{\sum_{j=1}^{m} w_j}$$

$$\frac{\sum_{j=n-m}^{n-1} w_{j-n+m+1} u(j)}{\sum_{j=1}^{m} w_j} = \quad (16b)$$

$$\frac{\sum_{j=n-m}^{n-1} w_{j-n+m+1}(x_2(j+1) - x_2(j) - x_1(j))}{\sum_{j=1}^{m} w_j} + \frac{\sum_{j=n-m}^{n-1} w_{j-n+m+1} y(j)}{\sum_{j=1}^{m} w_j}$$

Consider equation (16b). We can substitute for $x_1(j)$ from equation (16a) to get $$\frac{\sum_{j=n-m}^{n-1} w'_{j-n+m+1} u(j)}{\sum_{j=1}^{m} w'_j} = \quad (17)$$

$$\frac{\sum_{j=n-m}^{m} (w'_{j-n+m+1} - w'_{j-n+m+2})(x_2(i+1) - x_2(i))}{\sum_{j=1}^{m} w'_j} + \frac{w'_1 x_1(n-m)}{\sum_{j=1}^{m} w'_j} +$$

$$\frac{\sum_{j=n-m}^{n-1} (2w'_{j-n+m+1} - w'_{j-n+m+2}) y(j)}{\sum_{j=1}^{m} w'_j}$$

Here the prefilter and estimator terms employ different filter coefficients, and the prefilter has a very specific form based on the estimator coefficients. Thus, the design of the estimator filter becomes somewhat more complicated. It is still possible, however, to design the estimator such that the prefiltering of the input has any desired spectral characteristics (i.e. the estimator can be designed such that the filter coefficients of the prefilter take on any desired values). Note that in the new decoding equation (17), the error dependence on $x_1$ is limited to the first state of the time sequence n-m, . . . ,n.

ERROR CORRECTING DECODING USING QUANTIZED STATE ESTIMATES

In the previous sections it has been shown how the values of the states represent the error in a given filter's estimate of the input (or a filtered version thereof). If an M bit estimate (M significant bits) of the error term in equation (12) exists, then equation (12) can be rewritten in the form of equation (6).

The error has been reduced by M bits as compared to the error term in equation (12). The new estimator in equation (6) provides an additional M bits of performance. As mentioned in the first part of this section it is not practical to store and filter the analog states prior to quantization. Consider that M-bit estimates of the state values themselves are available. Equation (12) can be written in the form of equation (7) to give $$M\left(\vec{b} \sum_{j=n-m}^{n-1} w_{j-n+m+1} u(j)\right) = \quad (18)$$

$$M\left(\sum_{j=n-m}^{n-1} w_{j-n+m+1}(\vec{x}(j+1) - A\vec{x}(j)) - \right.$$

$$\left. \sum_{j=n+m+1}^{n-1} w_{j-n+m+1}(\hat{\vec{x}}(j+1) - A\hat{\vec{x}}(j)) \right) +$$

$$M\left(\vec{c} \sum_{j=n-m}^{n-1} w_{j-n+m+1} y(j) + \right.$$

$$\left. \sum_{j=n-m}^{n-1} w_{j-n+m+1}(\hat{\vec{x}}(j+1) - A\hat{\vec{x}}(j)) \right)$$

In an M-bit state value quantizer, with M sufficiently large, the approximation of white quantization noise holds fairly well, and the quantization errors of the state estimates will tend to cancel. The filter weighting, however, will introduce an average error into the estimate of the error term. Thus, while the above scheme does not typically improve the decimator performance by M-bits, a substantial enhancement of resolution does result. The exceptions to the above statement are the natural decoding equations, where the above error correcting scheme usually produces performance gains of very close to M-bits.

Thus, EC modulators/decimators implement two filters. The estimation filter (decimator), which filters the single bit output of the states, is identical to the one present in all current sigma-delta ADCs. In addition, EC systems implement a second filter, the error filter, which filters the quantized state estimates. The outputs of these two filters are added together to give the final result. The "level" of the error correcting refers to which of the N decoding equations is being implemented by the system. For example, if quantized estimates of the first state of a Candy system are taken and equation (15a) is used to design the error filter, we refer to this as Level 1 (L1) error correcting. FIG. 3b is a diagram of a second order, L1 error correcting (EC) modulator/decimator. The M-bit quantization 74 of the states is achieved using flash converters. Note that EC does not modify the single bit stream output of the modulator. EC makes observations of the modulators state and uses these observations to add corrections at the decimator stage.

SIMULATION RESULTS

In this section six systems are presented which employ error correcting decoding. Because EC systems implement corrections at the filter level by changing the decimator output, performance results for EC systems are referenced to the filtered output of the decimator. Recall that EC systems do not make any changes to the single bit output of the modulator and thus do not change the spectral characteristics of the modulator output. The performance enhancements that EC provides may vary with the particular decimation filter implemented, depending upon the how the state values were quantized, and thus performance measures for EC systems are always referred back to the particular decimation filter implemented to filter the single bit stream.

As a final note, the filters implemented in the following simulations placed no restrictions on the precision of the filter coefficients. In some of the cases, as much as 26 bit precision was used for the definition of filter coefficients. In an actual implementation the precision of the filter coefficients is limited (usually to less than 19 bits, typically 10 to 12-bits). This performance of these filters is therefore worse than the ones used for the simulations.

(I) CANIDY SYSTEM WITH L1 ERROR CORRECTING

Figure 7A:
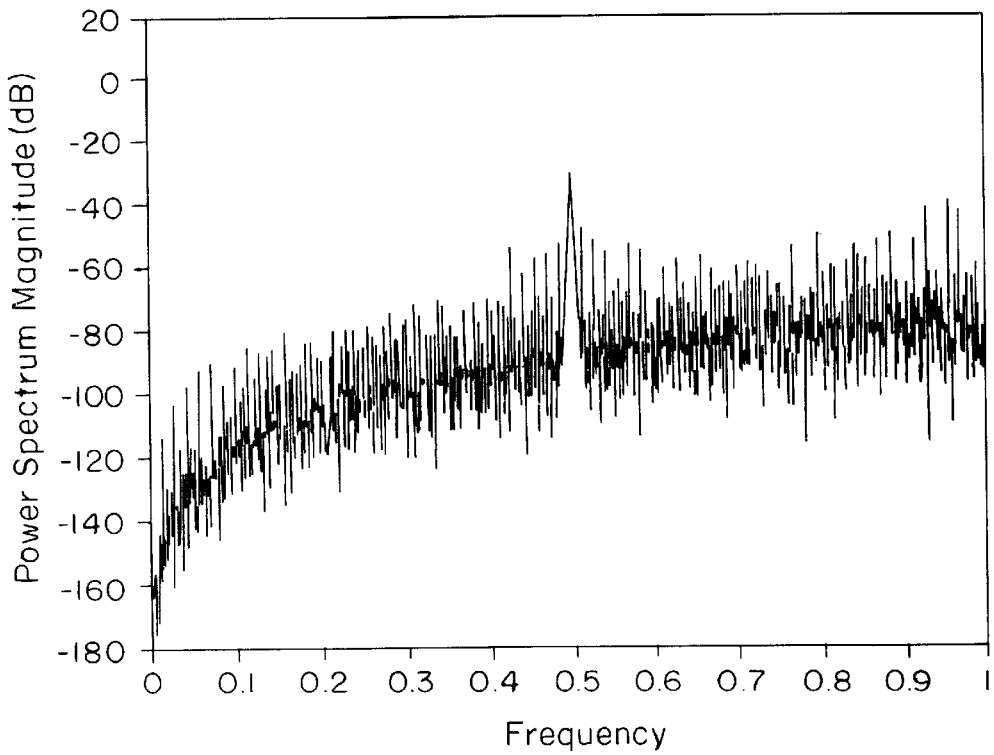
FIGS. 7a,b illustrate the spectral response of a Candy system with a 1-bit quantizer having an OSR of 32 without any error correction (FIG. 7a) and with L1 error correction (FIG. 7b).
Figure 7B:
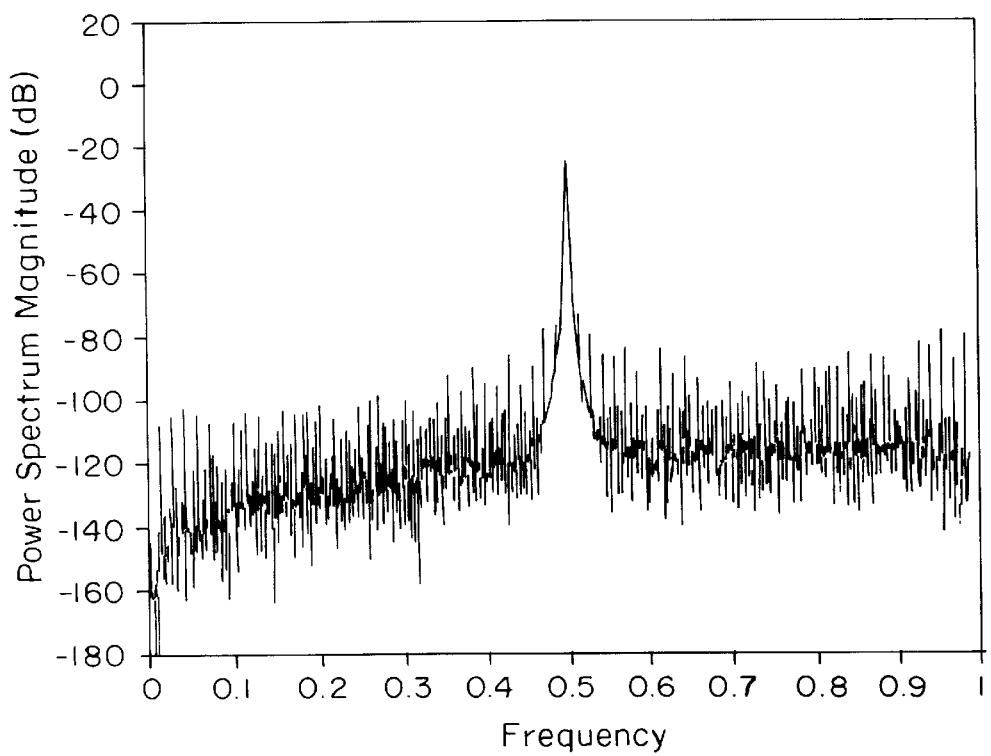

A preferred embodiment shown in FIG. 3b comprises a second order Candy system with level one (L1) error correction. The system was simulated with an 8-bit flash converter providing estimates of the first state value. The oversampling rate (OSR) for this simulation was 32, with the test signal being a sine wave of approximately −10 dB magnitude and normalized frequency of approximately $f_B/2$ (where $f_B$ is the signal band). The decimation filter employed was an equiripple filter of length 2047 taps, designed using a Parks-McClellan algorithm. The Parks-McClellan algorithm is described in 1) "Chebyshev Approximation for Non-recursive Digital Filters with Linear Phase," IEEE Trans. Circuit Theory, Vol. CT-19, Mar. 1972, pp. 189–194; and 2) "A Program for the Design of Linear Phase Finite Impulse Response Filters," IEEE Trans. Audio Electroacoust., Vol. AU-20, No. 3, Aug. 1972, pp. 195–199, both of which are incorporated herein by reference. The spectral characteristics of the filter are shown in FIG. 6. In this figure, unity represents $f_B$. Some of the simulation results are shown in FIG. 7. The performance of the decimator with no error correcting (FIG. 7a) is 60 dB. When error correcting is applied, the performance of the system jumps to 92 dB. Error correcting enhances the performance of the system by 32 dB, or 5.3 bits. Simulations were also run to test the performance of error correcting with white input noise of magnitude −120 dB present, and 10% coefficient mismatches in the modulator. Coefficient mismatches come about because when the output of the error correction filter is added to the output of the estimation filter, it must be scaled by a factor of $(c_1/b_1)$ where $c_1$ is the feedback gain and $b_1$ is the input gain. This scaling factor is implemented digitally, however the exact value it should take is determined by the actual values of $c_1$ and $b_1$ in the modulator. Since both $c_1$ and $b_1$ are implemented as analog coefficients in the modulator, their exact value will vary when fabricated. There will thus be a mismatch between the value of the scaling factor used, and the actual values of $c_1$ and $b_1$. A mismatch of more than 10% is unlikely to occur. The results of the input noise and coefficient mismatch simulations are summarized in Table 1. As can be seen, neither of these significantly effects the performance of error correcting.

(II) MULTI-BIT CANDY SYSTEM WITH L1 ERROR CORRECTING

Figure 8A:
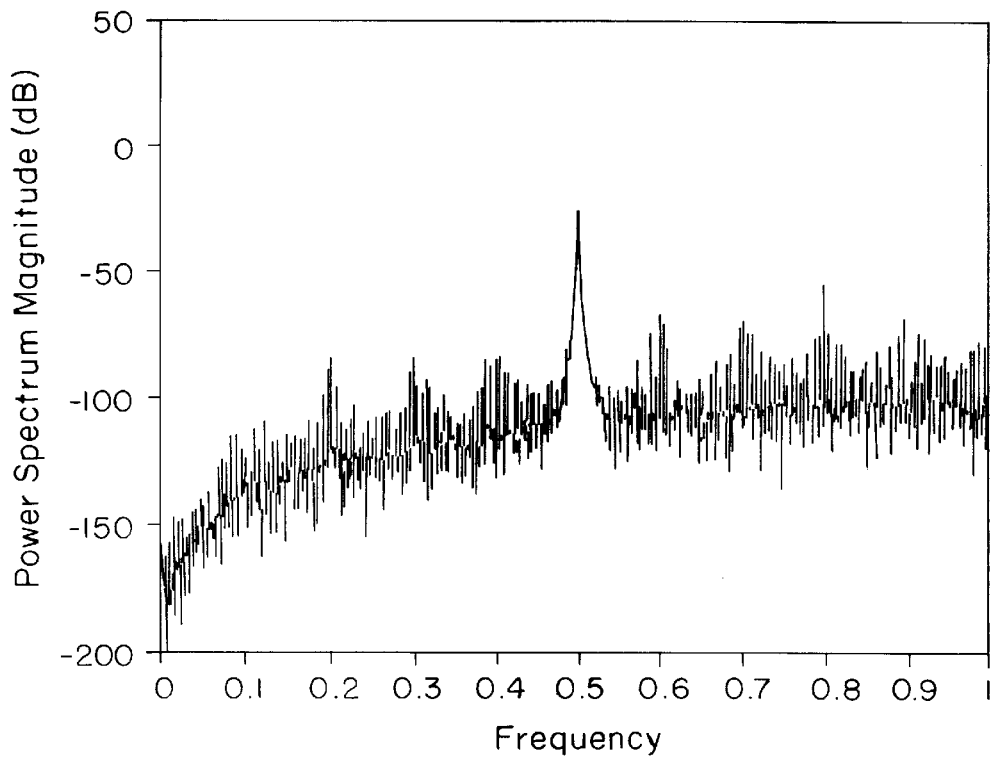
FIGS. 8a,b illustrate the spectral response of a Candy system with a 3-bit quantizer having an OSR of 32 without any error correction (FIG. 8a) and with L1 error correction (FIG. 8b).
Figure 8B:
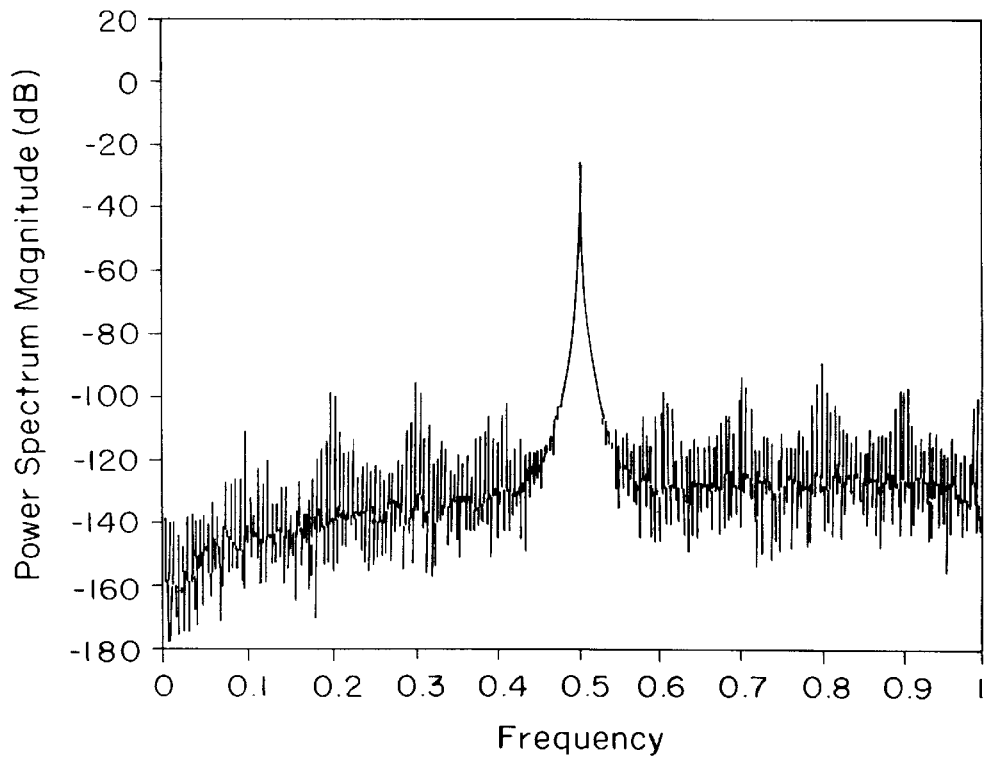

EC can also be applied to multi-bit systems with no modification of the error correction equations or the error filter. In the case of a multi-bit system, Θ, simply represents a multi-bit quantizer, rather than the single bit quantizer expressed in equation (2). All the other equations continue to hold. A Candy system employing a 3-bit quantizer was simulated. The quantization levels were selected to lie in the interval −1 to 1. This is by no means an optimal selection of quantization levels for this system, however the optimal selection of levels is a topic beyond the scope of the invention. The 3-bit DAC in the feedback path was implemented as an ideal DAC, perfectly matched to the 3-bit quantizer (ADC). The system was simulated at OSR=32 with the same test signal and filter as above. Again, an eight bit flash is used to provide the estimates of the first state value. FIG. 8 shows the results. The performance of the decimator with no error correcting (FIG. 8a) is about 75 dB. With EC, the performance of the system can be seen in FIG. 8b to be about 100 dB, an improvement of 25 dB or 4.15 bits. Once again, the effects observed due to input noise and coefficient mismatch changed the performance of the error correcting system by only a few dB.

(III) RESETTING CANDY SYSTEM WITH L2 ERROR CORRECTING

Recall that the error in the second natural decoding equation of the Candy system (equation (15b)) is dominated by the first state. If there were a way to cancel out the $x_1$ term, the performance of the system should increase by a factor of $(\frac{1}{2})(m+1)$, where m is the length of the decimation filter. Consider the system shown in FIG. 9. This system implements a ramp (coefficient space) filter 72 as described by equation (15b) with a length equal to OSR. In addition, a control circuit 188 resets the first state value $x_1(n)$ 175 to zero every OSR clock cycles. This means that the term $x_1(n-m)$ is equal to 0 in equation (15b) each time a filtering operation is performed. Therefore, the $x_1$ term in equation (15b) becomes zero and the performance of the system is improved by a factor of $(\frac{1}{2})$ (OSR+1) as compared to a modulator with no reset signal and a filter of equal length. Note that at this point there is no error correcting being performed. The reset signal itself 190 improves the performance of the system. If error correcting is to now be applied, only quantized estimates of the second state value $x_2(n)$ 192 are required.

Any size filter may be implemented in this system. However, the reset signal 190 causes loss of information in the bit stream and longer filter lengths do not provide as much performance enhancement as they do with no reset signal present. With no reset signal present a filter of length $m_1$ provides approximately a factor of $(m_1/m_2)$ improvement over a filter of length $m_2$. With the reset signal present, the improvement is only a factor of $(m_1/m_2)(osr/m_2)$.

Figure 9:
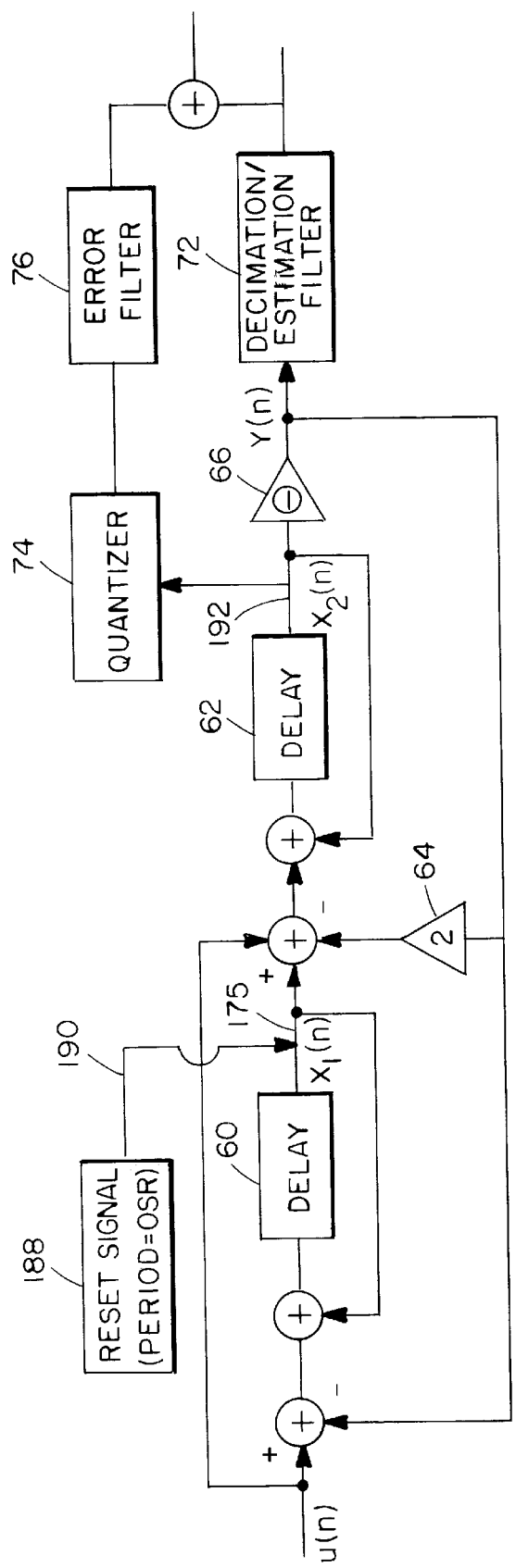
FIG. 9 is a block diagram of a Candy system employing L2 error correcting and a reset signal to cancel out the $x_1$ contribution to the error.
Figure 10A:
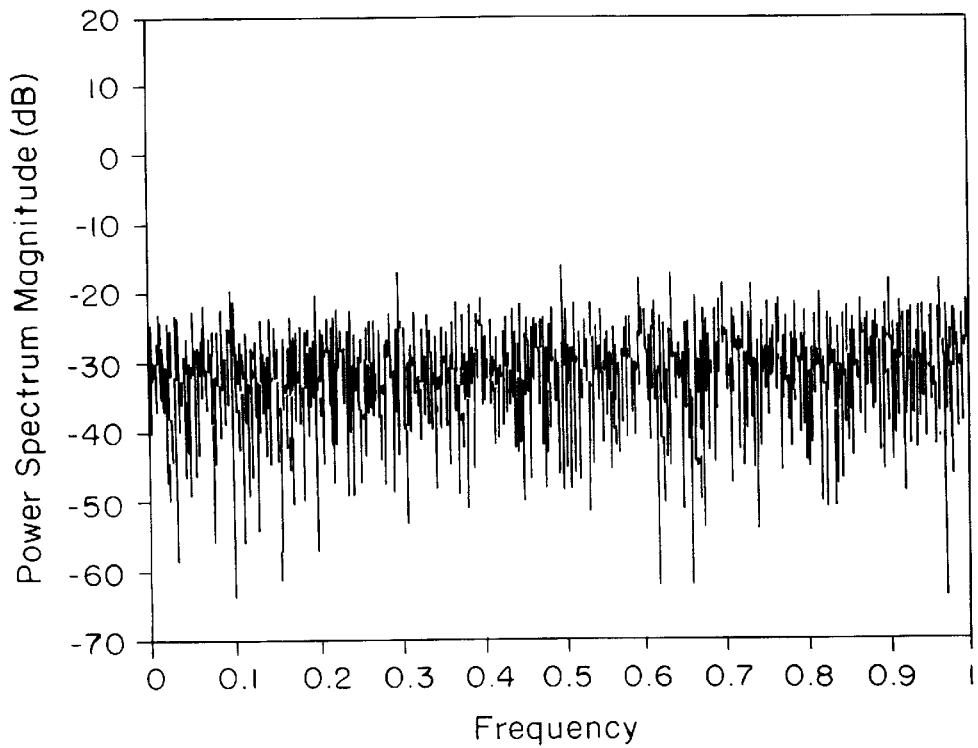
FIGS. 10a–c illustrate the spectral response of a Candy system having an OSR of 32 and a filter length of 32.
Figure 10B:
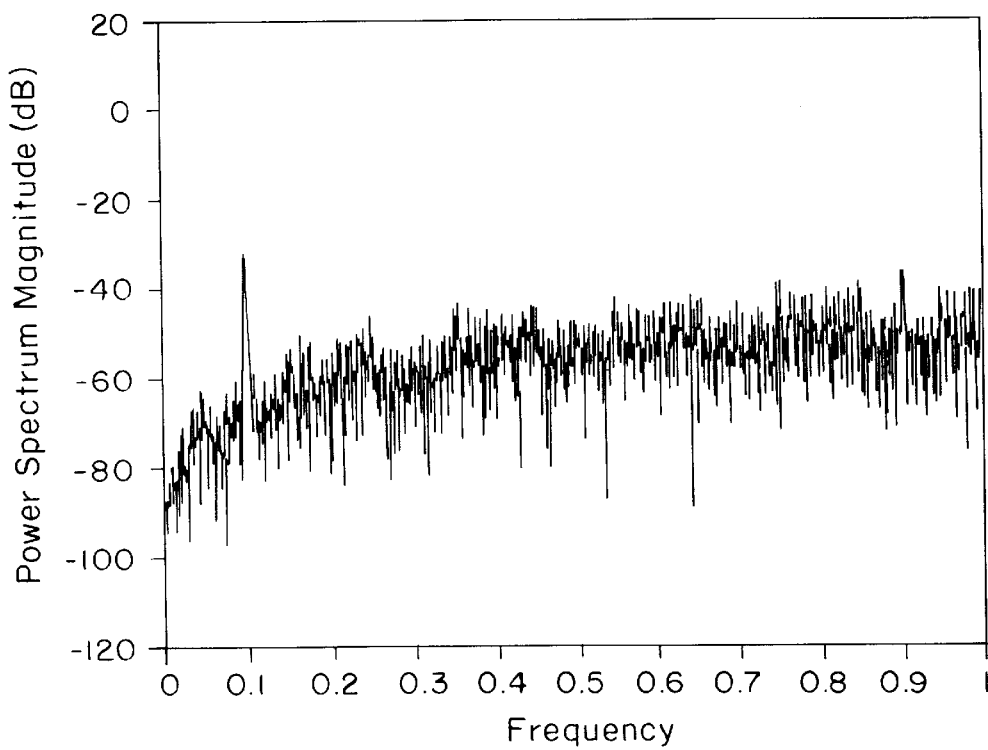
Figure 10C:
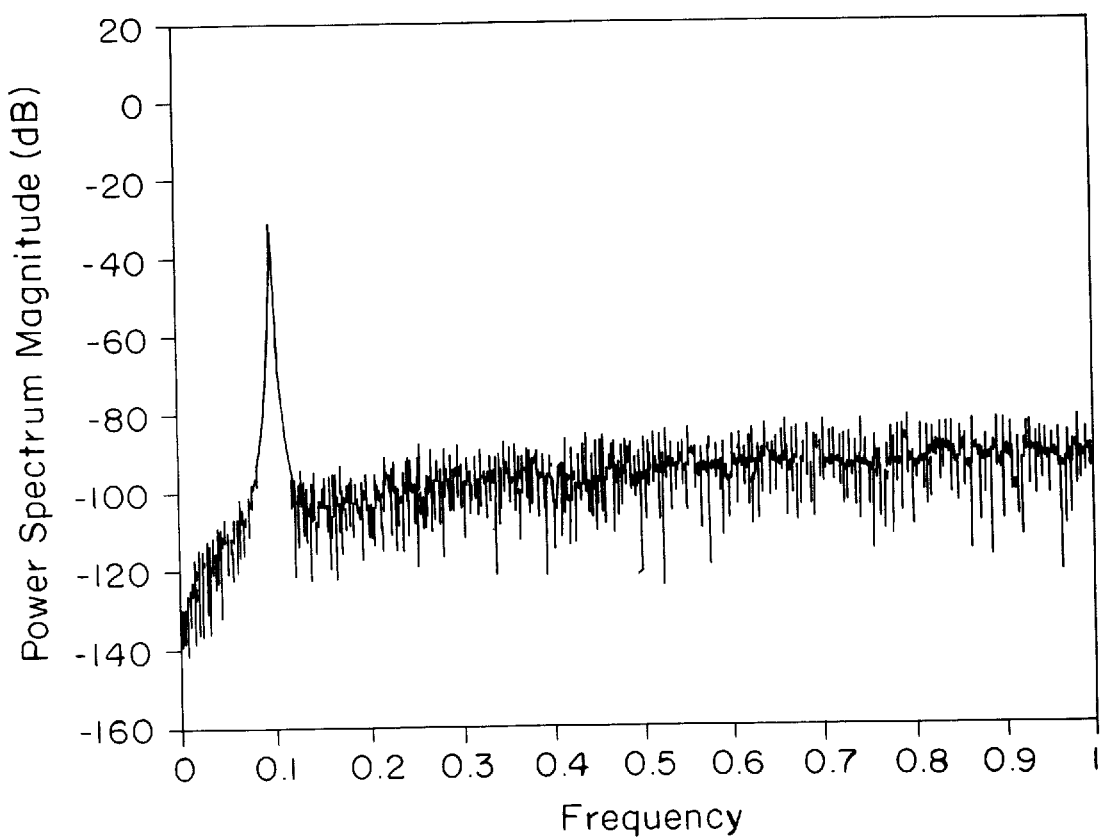

To demonstrate this principle, the system of FIG. 9 was simulated with an OSR of 32, and a ramp filter of length 32. The test signal was a −10 dB magnitude sine wave of frequency approximately $0.1f_B$. FIG. 10a shows the performance of the system when no reset signal is applied as about 36 dB. This is very poor performance but is not unexpected with a filter length of 32. The performance of the system when the reset signal is applied is shown in FIG. 10b and is approximately 52 dB, an improvement of 16 dB. Finally, FIG. 10c shows the performance of the system with the reset signal and level 2 EC decoding as approximately 97 dB, an improvement of 61 dB or 10.1 bits over the initial system. Input noise did not significantly affect the performance of the system, however coefficient mismatch did, as shown in Table 1. This is most probably due to the fact that a very short filter was implemented, go and thus mismatches in the coefficient values tend to be weighted more heavily.

Although not shown in FIG. 9, in an alternate embodiment, the error filter 76 may be used to control the reset signal 188.

(IV) CANDY SYSTEM WITH L1 VARIABLE LENGTH FILTERING (VLF)

Figure 11A:
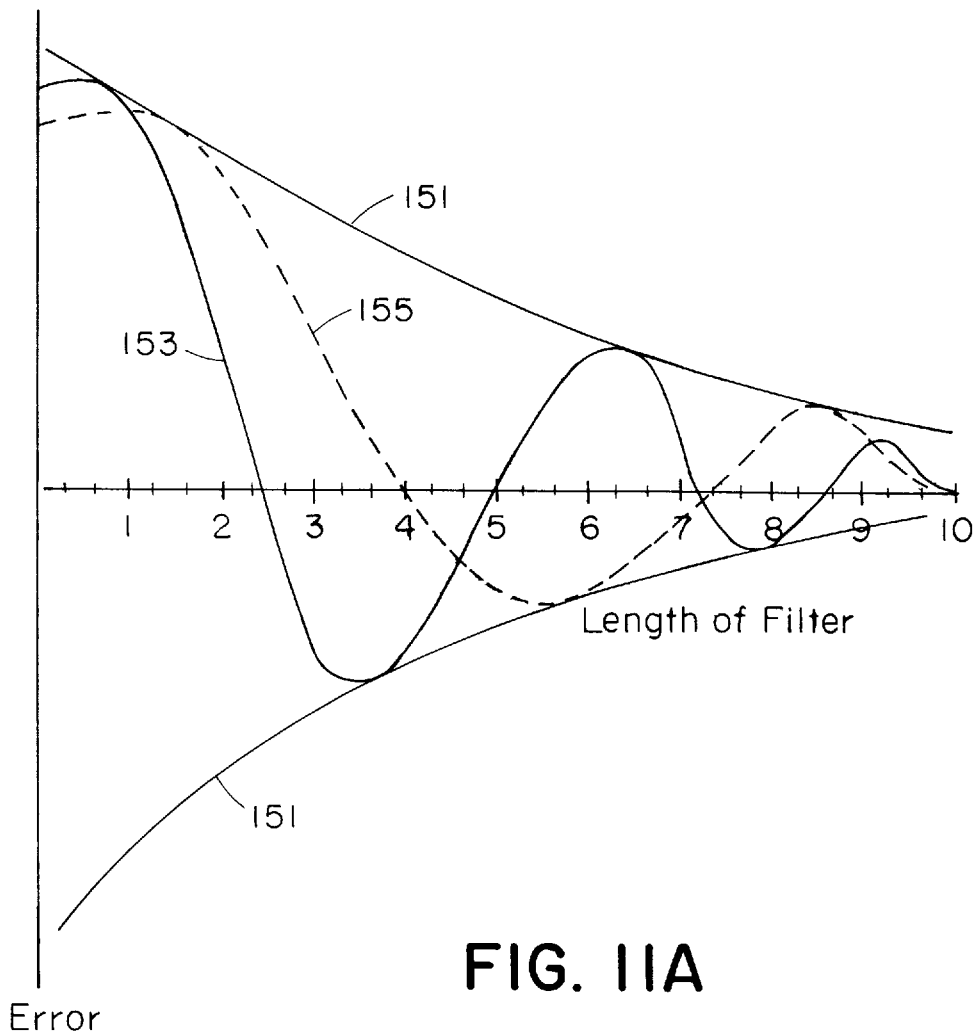
FIG. 11a is a graph plotting the error against the filter length for two different DC input levels.

FIG. 11a shows a graph of the error in the output signal plotted for two different DC levels. For any DC signal, the error is bound by the error envelope 151. As the filter gets longer, i.e., has more taps or previous samples, it does much better at averaging the input signal and the error envelope is smaller. The actual value of the error is dependent on both the length of the filter and the value or level of the input signal. The solid line 153 represents the error plotted against filter length for some DC input level. The dashed line 155 represents the error for another input level. While the error curves 153, 155 are shown as continuous lines, the actual error values are those at integer values of filter length.

Figure 11B:
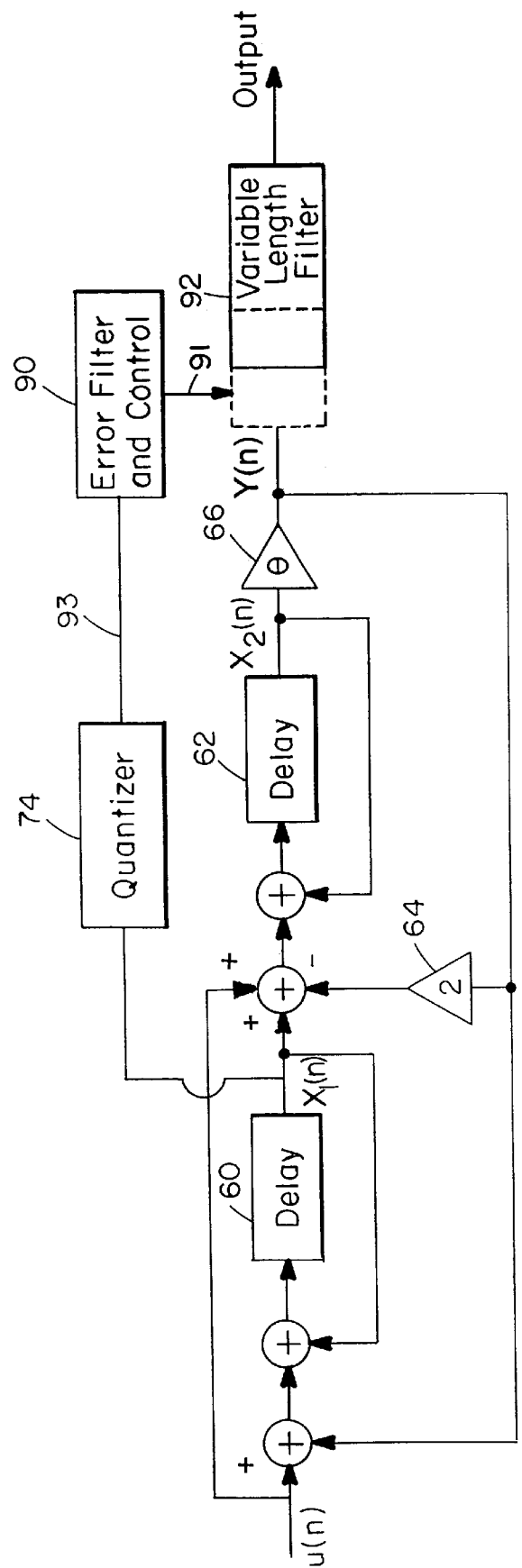
FIG. 11b is a block diagram illustrating error correcting being used to control the length of the decimator filter.

FIG. 11b is a diagram of a variable length filter system, in which the quantized state estimates are used as a control signal 95 rather than as an additive correction term. An error filter and controller 90 uses the quantized state estimates 97 to calculate the error (from equation (16)) for each filter length as the estimation filter 92 fills up. The smallest error and the position at which it occurred are stored and compared against the current error. When the estimation filter 92 has filled up, the controller 90 selects the position at which decoding should begin. Thus, the quantized state estimates 97 are used to control the decoding such that the modulation error is minimized.

One of the problems with this type of EC decoding is that of timing. When the input to the modulator is an AC signal, subsequent outputs of the variable length filter 92 are not separated by a constant number of clock cycles. Unless this separation is known and implemented accurately, the output becomes significantly distorted, effectively canceling out any gains achieved by the error correcting. This problem is still under investigation. However, for DC inputs, the timing issue is not important.

Figure 12:
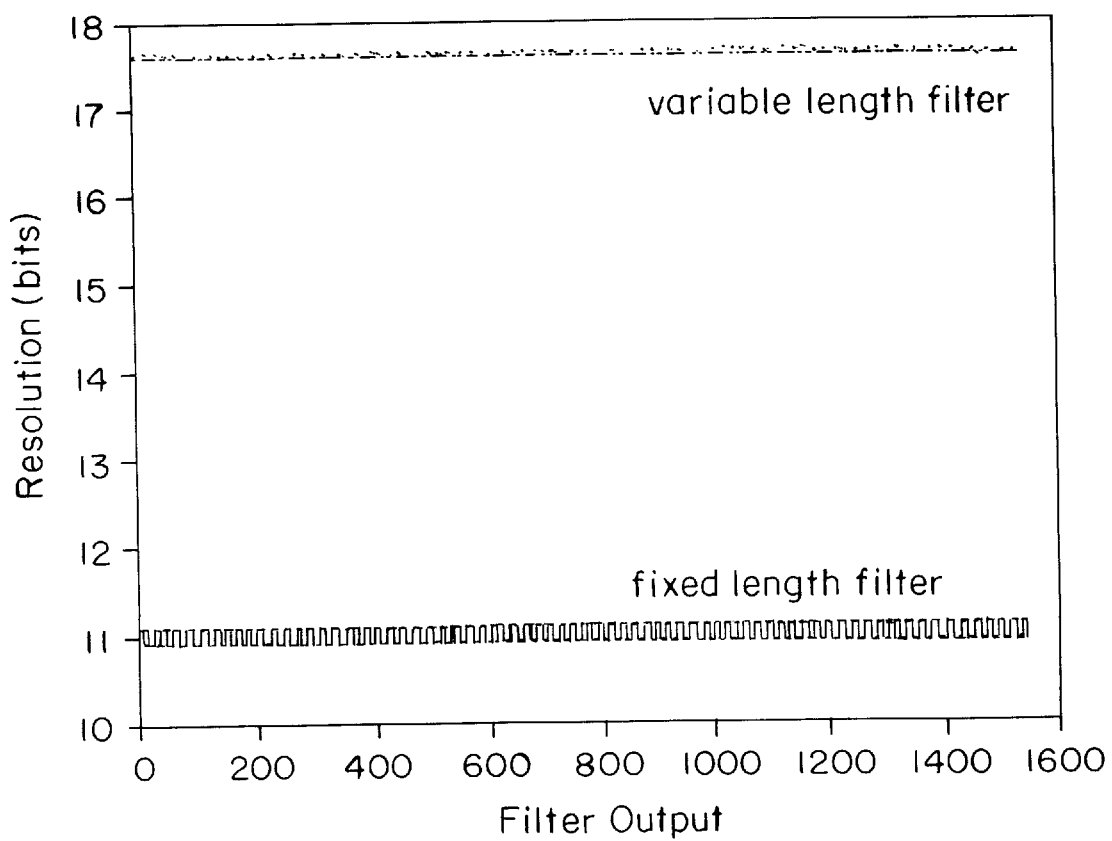
FIG. 12 illustrates a comparison of the resolution of: two Candy systems, one with a fixed length filter, and the other with a variable length filter of size 1984±64.

The system in FIG. 11b was simulated using a boxcar filter (all coefficients equal to unity) of length 1984±64. The input to the system was a DC signal of magnitude approximately −10 dB. The simulation results are shown in FIG. 12. The resolution of the output of the VLF system is compared to the resolution of the output of fixed filter length (1984) decoding with no error correcting. The worst case resolution for the fixed length filter is 10.9 bits, while for the VLF the worst case resolution is 17.6 bits, a gain of 6.7 bits. While input noise of −120 dB had no effect on the performance of VLF, coefficient mismatch of 10% completely wiped out the gains of VLF decoding. This has more to do with the fact that the input is DC than with the basic idea behind VLF decoding. The coefficient mismatch introduces a gain error which, while not as important for AC, is extremely important for DC inputs where gain terms determine the resolution of the output. With a coefficient mismatch of 10%, both the fixed length and VLF decimators produced outputs accurate to about 5 bits.

(V) FOURTH ORDER SYSTEM WITH L1 ERROR CORRECTING

FIG. 11a shows a graph of the error in the output signal plotted for two different DC levels. For any DC signal, the error is bound by the error envelope 151. As the filter gets longer, i.e., has more taps or previous samples, it does much better at averaging the input signal and the error envelope is smaller. The actual value of the error is dependent on both the length of the filter and the value or level of the input signal. The solid line 153 represents the error plotted against filter length for some DC input level. The dashed line 155 represents the error for another input level. While the error curves 153, 155. are shown as continuous lines, the actual error values are those at integer values of filter length.

Figure 13:
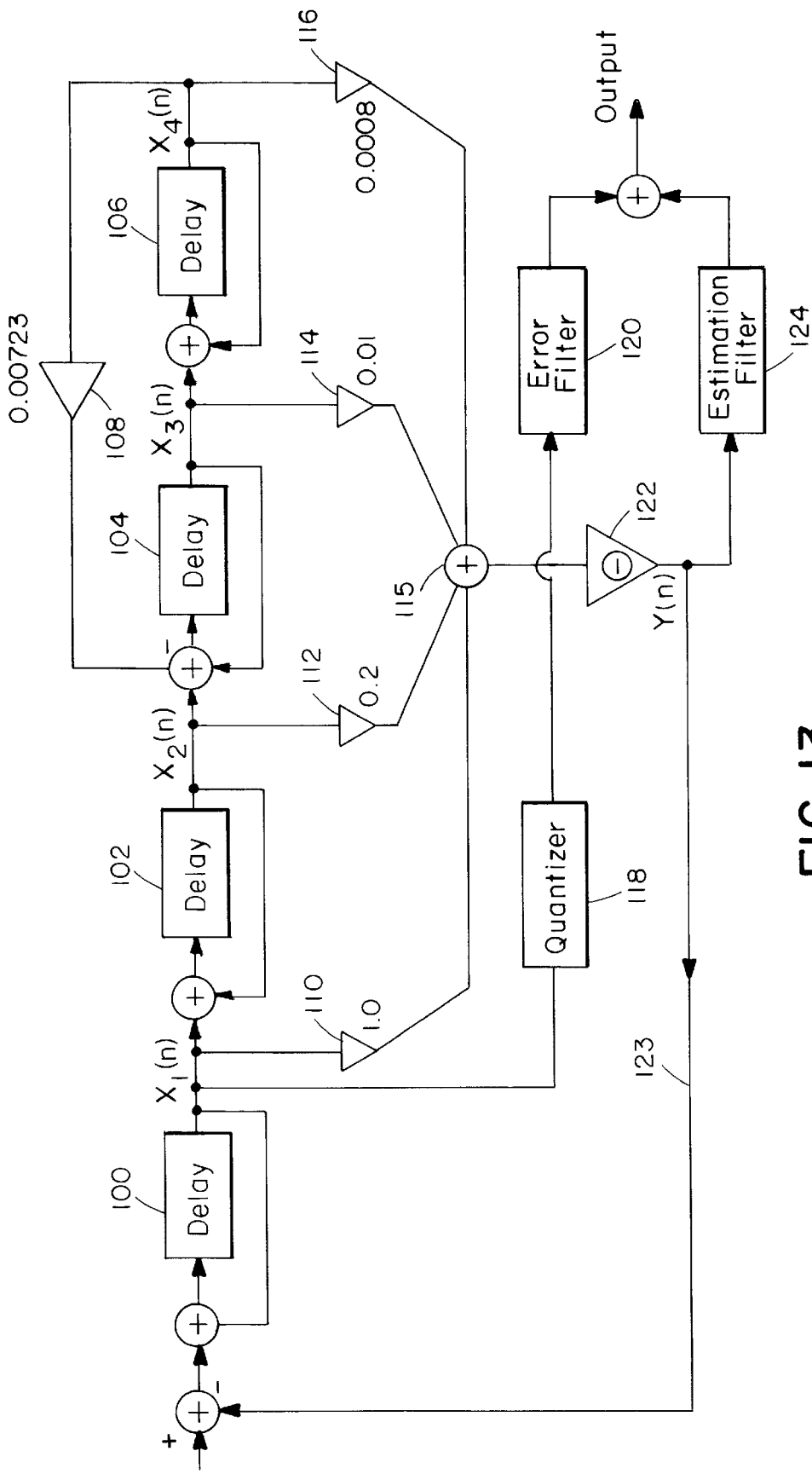
FIG. 13 is a block diagram illustrating a 4th-order modulator with L1 error correcting.
Figure 14A:
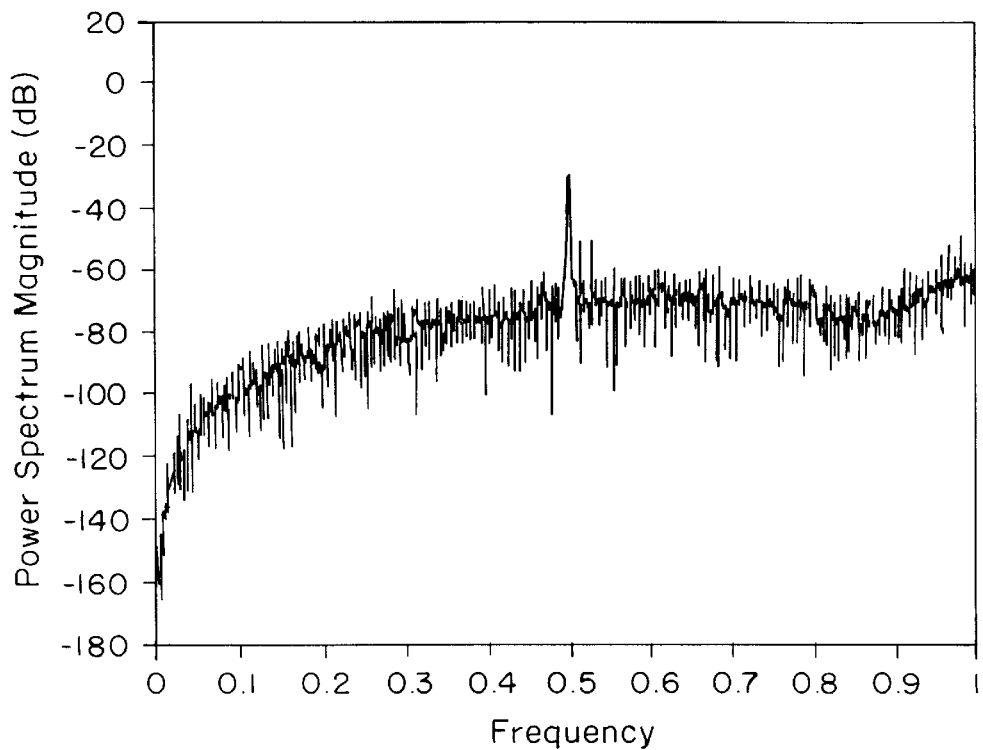
FIGS. 14a,b illustrate the spectral response of a 4th-order Candy system having an OSR of 32 without any error correction (FIG. 14a) and with L1 error correction (FIG. 14b).
Figure 14B:
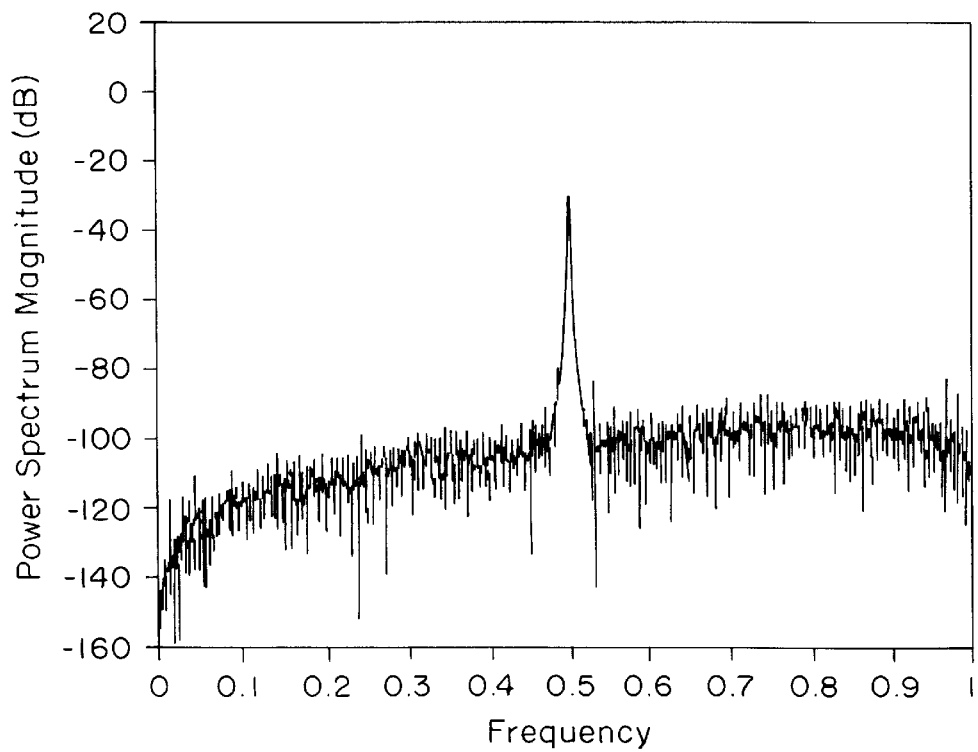

FIG. 13 illustrates a 4th order sigma-delta modulator, comprising delays 100, 102, 104 and 106, multipliers 110, 112, 114 and 116 which scale the state values $x_1(n)$–$x_4(n)$ of delays 100, 102, 104 and 106 respectively. The state values are summed by adder 115 and quantized by modulator quantizer 122 which provides feedback 123 to the input stage of the modulator and supplies the input to the estimation filter 124. In this particular system, state value $x_4(n)$ is fed back to the third-stage delay Delay 104 after being scaled by multiplier 108. The first state value $x_1(n)$ is quantized by state value quantizer 118 and used by the error filter 120 to estimate the error. This system was simulated with an OSR, test signal, and value estimation filter 124 identical to those used in simulating a preferred embodiment. The results are plotted in FIG. 14. FIG. 14a shows the performance of the system with no error correcting is about 72 dB while FIG. 14b shows that the performance of the EC system is 103 dB, an improvement of 31 dB. It is clear that this 4th order modulator is not the best possible modulator as its performance is only 72 dB, however this example demonstrates that EC decoding works for all order modulators. A better 4th order modulator will also gain from EC techniques.

(VI) LOW OSR CANDY SYSTEM WITH L1 ERROR CORRECTING

Figure 15A:
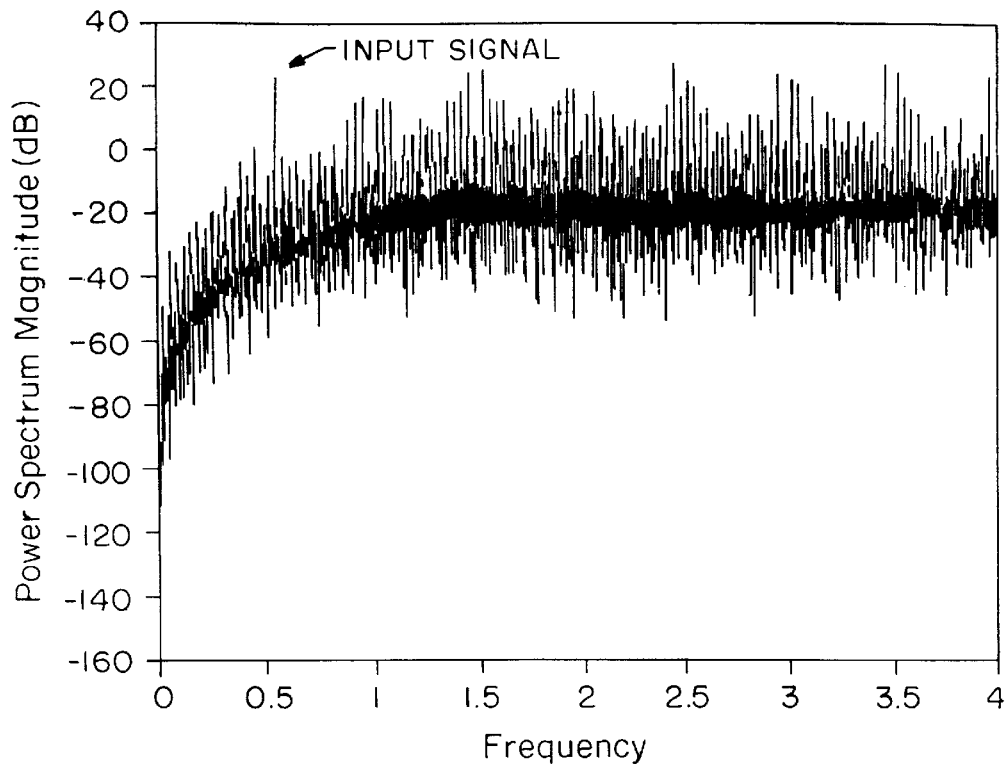
FIGS. 15a–c illustrate the spectral response of the system of FIG. 3b with an OSR of 4. The frequency is normalized so that 0–1 is the signal band. The input is marked.
Figure 15B:
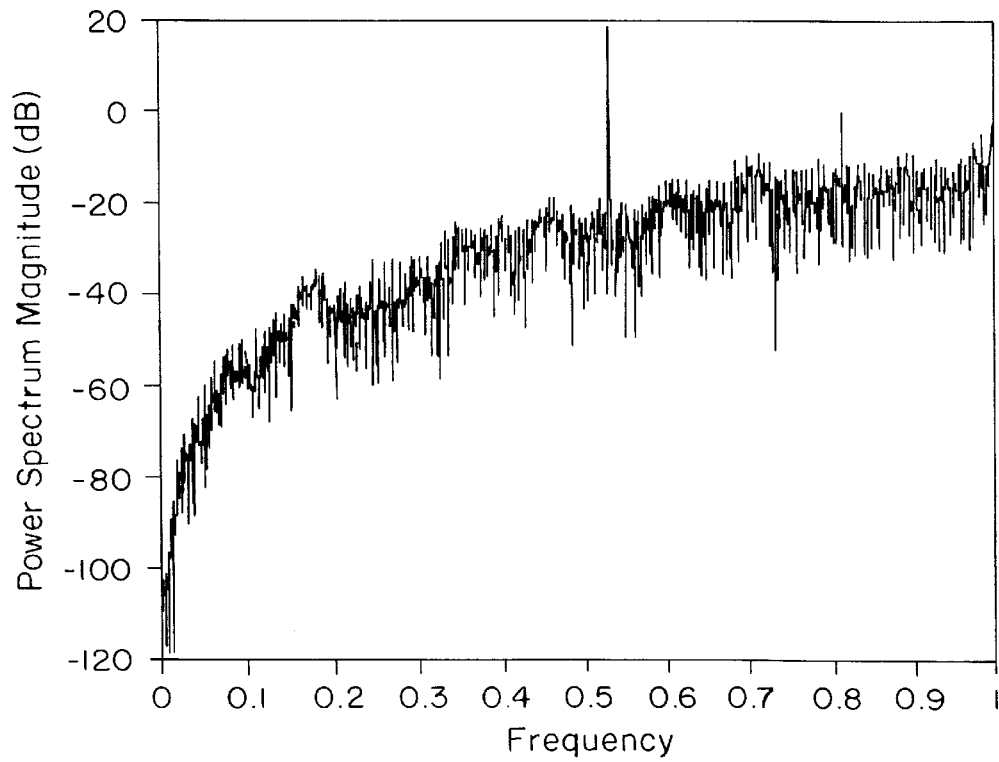
Figure 15C:
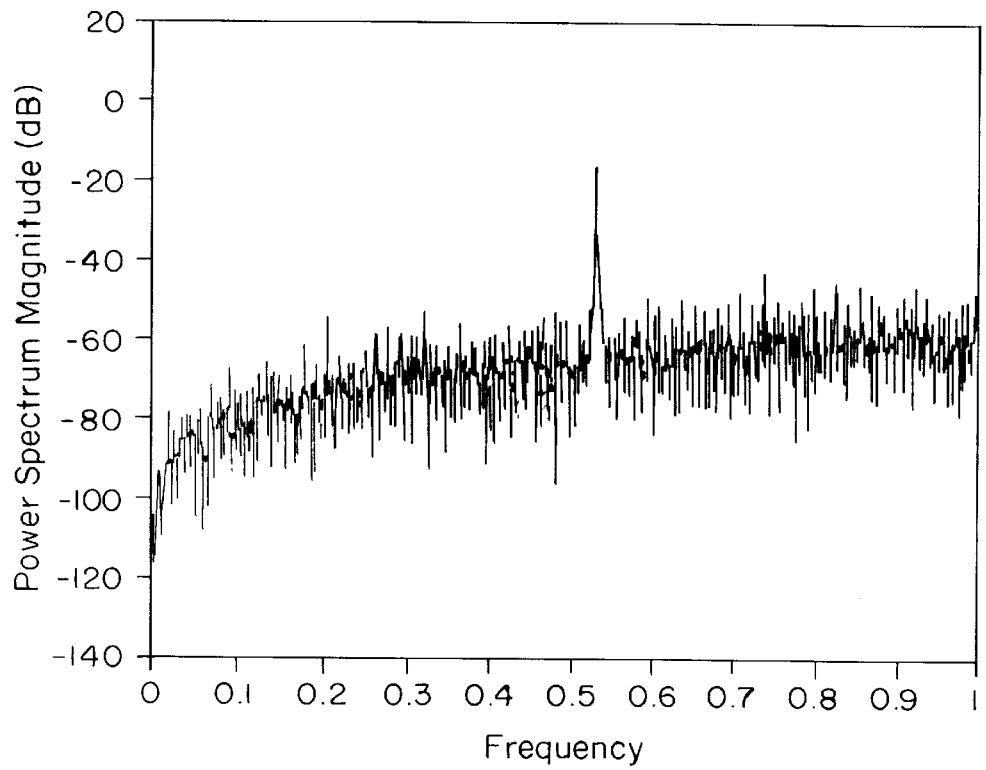

The same system as that shown in FIG. 3b was simulated with a low OSR. This demonstrates one of the strong points and power of EC decoding. This system was simulated with an OSR of 4, an input of magnitude approximately −10 dB and of frequency approximately $0.5f_B$. The estimation filter employed was a 1021 tap equiripple filter with stop band rejection of about 115 dB and once again 8 bit estimates of the modulator state were used. The results of this simulation are shown in FIG. 15 (note that in all the graphs in FIG. 15 the signal band, $f_B$, is normalized to 1). FIG. 15a is a spectrum of the single bit output of the modulator before any filtering is performed. As can be seen, the signal lies fairly high up in the noise band and is almost completely swamped out by the modulator noise. FIG. 15b shows the results of filtering the bit stream with the estimation filter. The performance of the system is no more than 18 dB. FIG. 15c shows the performance of the system with error correcting. The performance of the system jumps to approximately 62 dB. This is a 44 dB improvement in performance of the system. Error correcting is extremely powerful at low OSR where there is a lot of noise in the system and, hence, a large error. This is examined in more detail in the next section.

CALIBRATION

Figure 5:
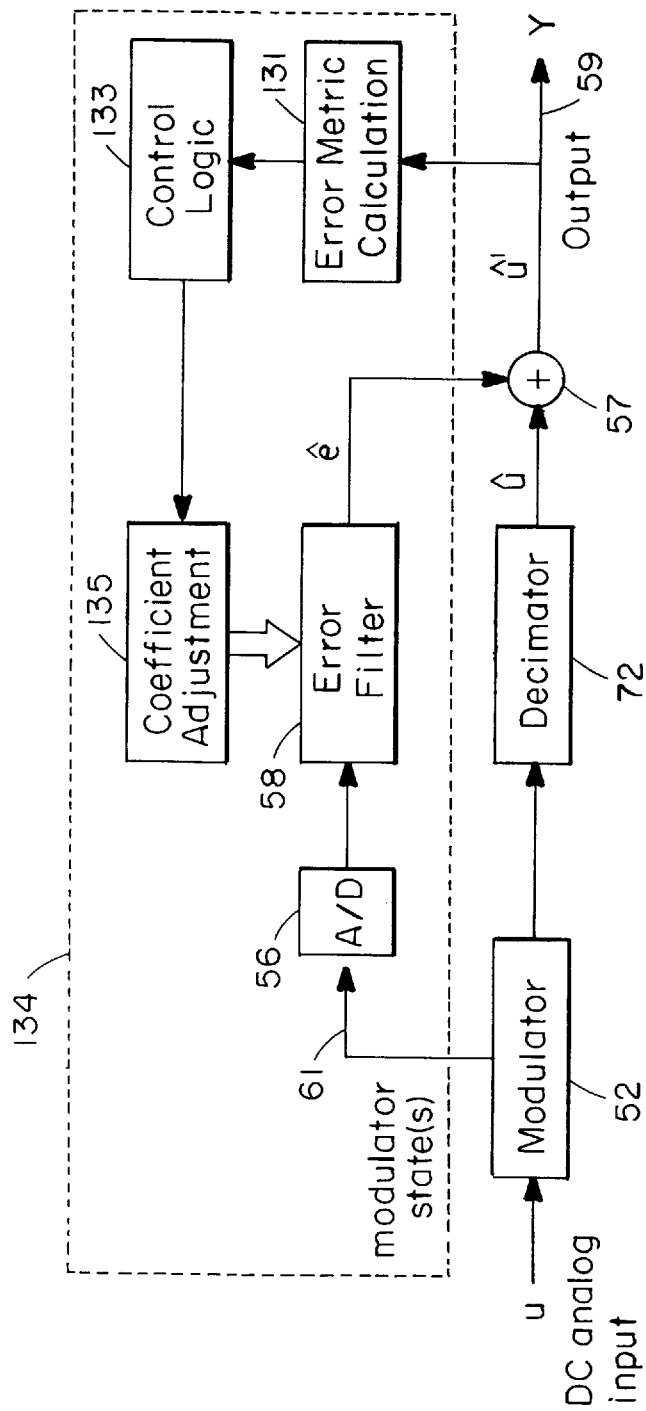
FIG. 5 is a block diagram illustrating the calibration scheme.

FIG. 5 illustrates a scheme for calibrating the error correction mechanism. Added to the EC sigma-delta converter previously described are error metric calculation circuitry 131, calibration control logic 133 and error filter coefficient adjustment logic 135.

If a DC input is applied to the system, then the output of the decimator 72 should be constant value. However, because of the inherent error in conversion, the output fluctuates around an average value. The size of these fluctuations is determined by the resolution of the system. If the error is not corrected for (as in an unmodified system—i.e., everything outside the dotted box 134) then the fluctuations of the output are of the order of e where:

$$\hat{u} = u - e \qquad (19)$$

and $\hat{u}$ is the decimator output, u is the DC input, and e is the error in the conversion. If an estimate of e is made and a correction is applied, then the magnitude of the fluctuations will be on the order of ê', where ê' is the conversion error after correction, i.e.

$$\hat{u}'=u-\hat{e}'=u-(e-\hat{e}) \qquad (20)$$

where û' is the output of the system, Y, and ê is the estimate of the conversion error in the unmodified system. Assuming that the correction is applied correctly, the overall conversion error should be reduced i.e.

$$\hat{e}'<<e \qquad (21)$$

If the calculation of the error is inaccurate due to voltage reference mismatches between the quantizers and/or coefficient variations of the modulator parameters, the fluctuations of the output will be increased. In some cases, these mismatches could cause the output fluctuations to be larger than the original unmodified error, e. The calibration circuitry 131, 133, 135 adjusts the error filter 58 coefficients by an overall scale factor and monitors the size of the output fluctuations. The calibration selects the scale factor which minimizes these output fluctuations, thereby correcting for mismatches in the reference voltage and modulator parameters.

In an alternate embodiment, the calibration circuitry 131, 133, 135 adjusts the decimation filter 72 coefficients. This adjustment is not shown in FIG. 5.

MULTIPLE STATE ERROR CORRECTION

Figure 17:
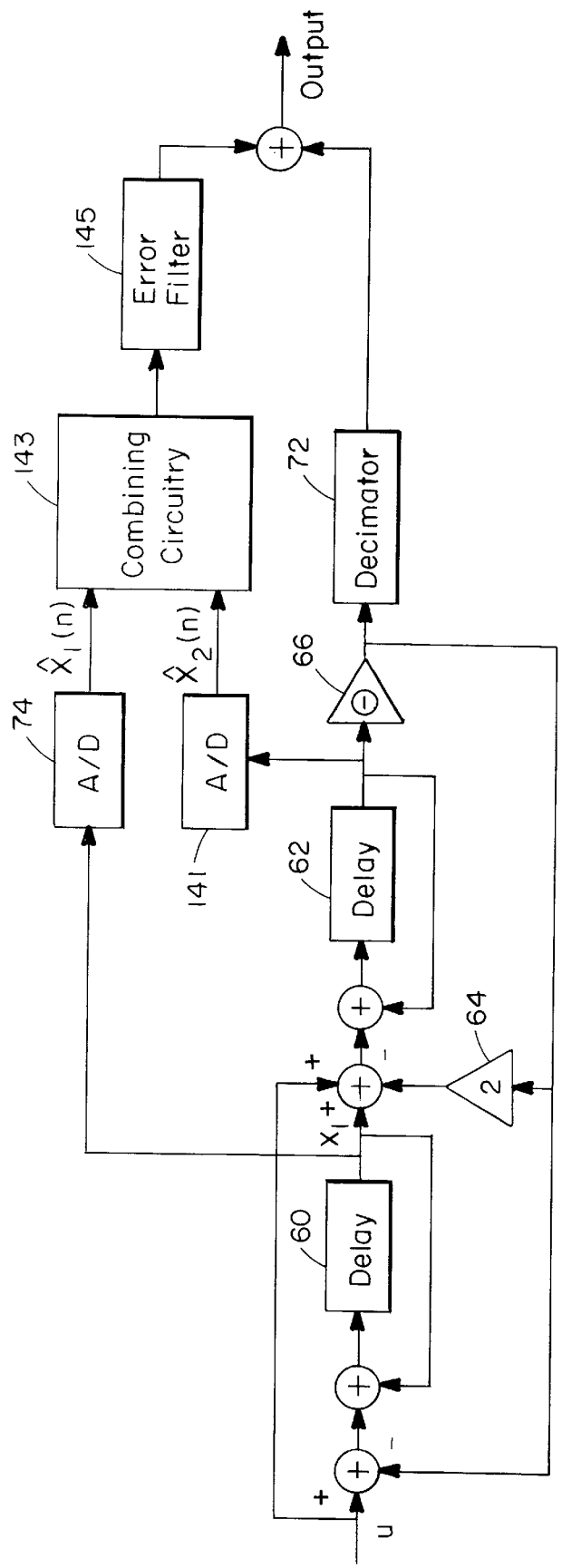
FIG. 17 illustrates a multiple state error correction system.

FIG. 17 illustrates a system in which multiple state values are individually quantized and used to calculate the error estimation. In this two-stage modulator, internal state values $x_1(n)$ and $x_2(n)$ are quantized by state value quantizers (ADCs) 74 and 141 respectively. The outputs of the ADCs, $\hat{x}_1(n)$ and $\hat{x}_2(n)$, representing quantized estimates of the states $x_1(n)$ and $x_2(n)$, are combined by combining circuitry 143. The output of the combining circuitry 143 is passed to an error filter 145 which, as in the previously described embodiments, produces an error estimate which is added to the output of the decimator 72.

SINGLE FILTER EMBODIMENT

Figure 18:
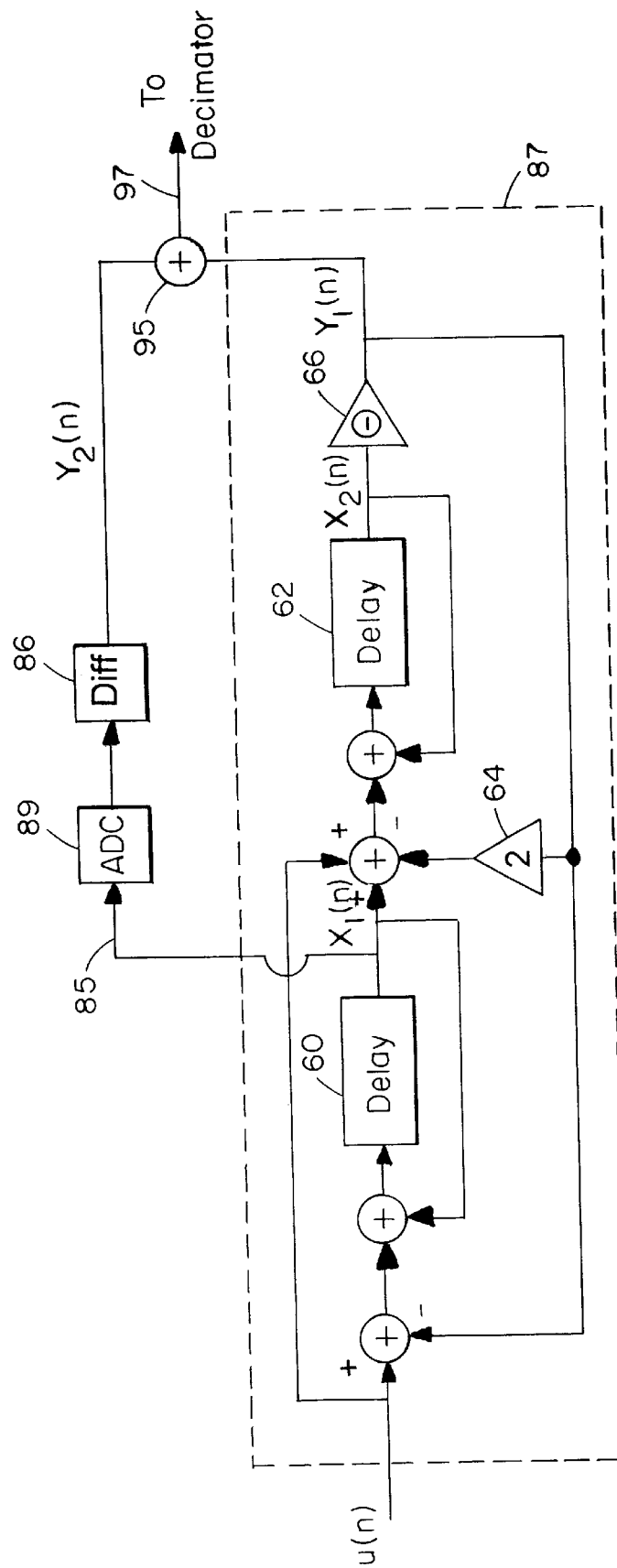
FIG. 18 illustrates an error correction system using one filter.

FIG. 18 illustrates an alternative embodiment of the present invention in which only a single filter is used. A state value $x_1(n)$ is quantized by state value quantizer (ADC) 89. The quantized value is then applied to a differentiator 86 which outputs $y_2(n)$, the difference between its current input and its previous input. The reference voltages of the state value quantizer 89 and the single bit modulator quantizer 66 are matched. The Output $y_2(n)$ of the differentiator 86 is then added 95 with the output $y_1(n)$ of the standard non-corrected sigma-delta modulator such that the single bit output $y_1(n)$ forms the most significant bit of the combination output 97. The combination output 97 is then processed by a single decimation filter.

TABLE 1

Performance Enhancement due to Error Correcting/Overall Performance System

| (OSR = 32 except*) | Ideal System | Input Noise (−120 dB) | Coefficient Mismatch |
|---|---|---|---|
| Candy L1 | 32/92 dB | 31/93 dB | 28.5/87 dB |
| Candy Multi-Bit L1 | 25/100 dB | 25/99 dB | 23/99 dB |
| Candy Reset L2 | 61/97 dB | 58/95 dB | 35/77 dB |
| **Candy VLF | 6.7/17.6 bits | N/A | 0.0/5.1 bits |
| Fourth Order L1 | 31/103 dB | 31/105 dB | 30/98 dB |
| *Candy OSR = 4 | 44/62 dB | 51/70 dB | 41/60 dB |

**N/A — The simulation was not performed

What is claimed is:

1. An analog/digital converter comprising:
   a modulator which converts an analog input into a high frequency bit stream, said modulator comprising at least one delay stage, and each delay stage having a state value;
   a decimator which receives the high frequency bit stream to produce a first reduced frequency multibit signal output;
   a state value quantizer which quantizes said state value;
   a state value processor which receives the quantized state value to produce a state value processor output which is used to provide a reduced error reduced frequency multibit signal output from the first reduced frequency multibit signal.

2. A converter as claimed in claim 1 wherein said state value processor comprises an error estimator which receives the quantized state value to produce an estimate of error in the first reduced frequency multibit signal relative to the analog input.

3. A converter as claimed in claim 2 wherein the high frequency bit stream is filtered to produce the first multibit signal, a state value of the modulator is filtered to produce a second multibit signal, and the first and second multibit signals are combined to provide an output multibit signal.

4. A converter as claimed in claim 2 wherein the decimator comprises a filter to produce a varying first multibit signal from the high frequency bit stream and the error estimator selects the multibit signal output from the filter.

5. A converter as claimed in claim 4 wherein the filter is a finite impulse response filter and the error estimate controls the length of the filter to minimize the error.

6. A converter as claimed in claim 2 wherein the decimator is a first finite impulse response filter and the error estimator is a second finite impulse response filter.

7. A converter as claimed in claim 6 further comprising means for calibration of said first finite impulse response filter with said second finite impulse response filter.

8. A converter as claimed in claim 7 wherein said means for calibration comprises:
   means for calculating an error metric of the converter output while the input to the converter is DC; and
   means for adjusting the filter coefficients of said second finite impulse response filter to minimize said error metric of the output.

9. A converter as claimed in claim 7 wherein said means for calibration comprises:
   means for calculating an error metric of the converter output while the input to the converter is DC; and
   means for adjusting the filter coefficients of said first finite impulse response filter to minimize said error metric of the output.

10. A converter as claimed in claim 1 wherein at least one state value is periodically reset to a constant value.

11. A converter as claimed in claim 10 wherein at least one state value is reset at the oversampling rate or a submultiple thereof.

12. A converter as claimed in claim 10 wherein said constant value is zero.

13. A converter as claimed in claim 10 wherein up to the first N−1 states of an N state modulator are reset.

14. A converter as claimed in claim 10 wherein the first M−1 states of an N state modulator are reset and the Mth state is used by the error estimator.

15. A converter as claimed in claim 10 wherein the state value processor output is used to control the resetting of the state value.

16. A converter as claimed in claim 1 further comprising a plurality of state value quantizers, said state value quantizers quantizing respective state values of the modulator in order to derive the state value processor output, said state value quantizers having one or more quantization levels.

17. A converter as claimed in claim 16 wherein said state value quantizers are flash analog-to-digital converters.

18. A converter as claimed in claim 16 wherein said state value quantizers are pipelined analog-to-digital converters.

19. A converter as claimed in claim 16 wherein the quantization levels are spaced evenly.

20. A converter as claimed in claim 16 wherein the quantization levels are spaced logarithmically.

21. A converter as claimed in claim 1 wherein the high-frequency bit stream is a single-bit bit stream.

22. A converter as claimed in claim 1 wherein the oversampling ratio is less than 8.

23. A converter as claimed in claim 1 wherein the oversampling ratio is 4.

24. A converter as claimed in claim 1 wherein the modulator has low-pass characteristics.

25. A converter as claimed in claim 1 wherein the modulator has band-pass characteristics.

26. A converter as claimed in claim 1 wherein the state value processor comprises a differentiator, the output of the differentiator and the output of the high frequency bit stream being combined such that the decimator receives the combined output to produce a reduced error reduced frequency multibit signal.

27. An analog/digital converter comprising:
  an Nth-order sigma-delta modulator comprising N delay stages, each delay stage having a state value, and a first m-bit modulator quantizer for generating a first m-bit digital output;
  at least one n-bit state value quantizer generating a digital estimate of an internal state value of said modulator;
  a state value processor for processing at least one digital estimate of the internal state value to generate a state value processor output; and
  an output circuit combining the m-bit digital output and the state value processor output to produce a decimated output.

28. A converter as claimed in claim 27 wherein the state value processor comprises a state value digital filter, and the output circuit further comprises a decimation filter for filtering and decimating the m-bit digital output and a combining circuit to combine the output of the decimation filter and the state value digital filter to produce said decimated output.

29. A converter as claimed in claim 27 wherein the state value processor comprises a differentiator and the output circuit further comprises a combining circuit and a decimation filter, said combining circuit combining the modulator m-bit digital output and the differentiator output to produce a combined output signal, and said decimation filter filtering and decimating said combined output signal to produce said decimated output.

30. A method of analog to digital conversion comprising the steps of:
  modulating an analog input into a high-frequency bit stream, said modulating step producing at least one state value;
  filtering and decimating the high-frequency bit stream by combining plural bits of the high-frequency bit stream to produce a first reduced-frequency multibit signal;
  quantizing at least one state value produced in said modulating step;
  generating an error estimate representing the error between the first reduced-frequency multibit signal and the analog input; and
  using the error estimate to generate a reduced-error reduced-frequency multibit signal output from the first reduced-frequency multibit signal.

31. A conversion method as claimed in claim 30 wherein filtering and decoding comprises filtering the high-frequency bit stream to produce the first multibit signal, generating an error estimate comprises filtering a state value obtained during encoding to produce a second multibit signal, and using the error estimate comprises combining the first and second multibit signals to provide an output multibit signal.

32. A conversion method as claimed in claim 30 wherein filtering and decimating comprises filtering the high-frequency bit stream to produce a varying first multibit signal and using the error estimate to select the multibit signal output from a filter.

33. A conversion method as claimed in claim 32 wherein the filtering is performed by a finite impulse response filter, said conversion method further comprising controlling the length of the filter with the error estimate to minimize error.

34. A conversion method as claimed in claim 30 wherein the first reduced-frequency multibit signal is the output of a first finite impulse response filter, and the error estimate is the output of a second finite impulse response filter.

35. A conversion method as claimed in claim 34 further comprising the step of calibrating said first finite impulse response filter with said second finite impulse response filter.

36. A conversion method as claimed in claim 35 wherein the step of calibrating further comprises:
  calculating an error metric of the output of the first finite impulse response filter while the analog input remains constant; and
  adjusting the filter coefficients of said second finite impulse response filter to minimize said error metric.

37. A conversion method as claimed in claim 35 wherein the step of calibrating further comprises:
  calculating an error metric of the output of the first finite impulse response filter while the analog input remains constant; and
  adjusting the filter coefficients of said first finite impulse response filter to minimize said error metric.

38. A conversion method as claimed in claim 30 further comprising resetting at least one state value to zero before combining plural bits of the high-frequency bit stream to produce the first reduced-frequency multibit signal.

39. A conversion method as claimed in claim 38 further comprising the step of resetting at least one state value to zero at the oversampling rate, or a submultiple thereof.

40. A conversion method as claimed in claim 38 further comprising using the error estimate to control the resetting of the state value.

41. A conversion method as claimed in claim 30 further comprising the step of quantizing to one or more quantization levels said state values to derive the estimated error.

42. A conversion method as claimed in claim 41 wherein said quantizing is performed by a flash analog-to-digital converter.

43. A conversion method as claimed in claim 41 wherein said quantizing is performed by a pipelined analog-to-digital converter.

44. A conversion method as claimed in claim 41 wherein the quantization levels are spaced evenly.

45. A conversion method as claimed in claim 41 wherein the quantization levels are spaced logarithmically.

46. A conversion method as claimed in claim 30 wherein the high-frequency bit stream is a single-bit bit stream.

47. A conversion method as claimed in claim 30 wherein the oversampling ratio is less than 8.

48. A conversion method as claimed in claim 30 wherein the oversampling ratio is 4.

49. A conversion method as claimed in claim 30 wherein modulating provides low-pass filtering.

50. A conversion method as claimed in claim 30 wherein modulating provides band-pass filtering.

51. An analog/digital converter comprising:

a sigma-delta modulator which converts an analog input into a high frequency bit stream, said sigma-delta modulator comprising at least one delay stage, each delay stage having a state value;

a decimator which receives the high frequency bit stream to produce a first reduced frequency multibit signal output; and a reset circuit, said reset circuit periodically resetting at least one state value at the oversampling rate, or a submultiple thereof.

* * * * *